United States Patent
Huettner

(10) Patent No.: US 8,952,752 B1
(45) Date of Patent: Feb. 10, 2015

(54) SMART POWER COMBINER

(71) Applicant: Steven E. Huettner, Tucson, AZ (US)

(72) Inventor: Steven E. Huettner, Tucson, AZ (US)

(73) Assignee: Nuvotronics, LLC, Radford, VA (US)

( * ) Notice: Subject to any disclaimer, the term of this patent is extended or adjusted under 35 U.S.C. 154(b) by 79 days.

(21) Appl. No.: 13/712,676

(22) Filed: Dec. 12, 2012

(51) Int. Cl.
*H03F 3/68* (2006.01)
*H03F 1/56* (2006.01)

(52) U.S. Cl.
CPC ........................ *H03F 1/56* (2013.01)
USPC ........................ 330/84; 330/124 R

(58) Field of Classification Search
CPC ........... H03F 3/68; H03F 3/211; H03F 3/195; H03F 1/0277; H03F 2200/207; H03F 2200/411; H03F 1/36; H03F 3/3081; H03F 1/54; H03F 3/45475; H03F 3/24; H03F 2200/451; H03F 3/602; H03F 3/604; H03F 3/72; H03F 1/0288
USPC ........................ 330/84, 124 R, 295
See application file for complete search history.

(56) References Cited

U.S. PATENT DOCUMENTS

| | | | |
|---|---|---|---|
| 2,502,479 A | 4/1950 | Pearson et al. | |
| 4,590,446 A | 5/1986 | Hsu et al. | |
| 4,812,782 A | 3/1989 | Ajioka | |
| 5,079,527 A | 1/1992 | Goldfarb | |
| 5,117,377 A | 5/1992 | Finman | |
| 5,126,704 A | 6/1992 | Dittmer et al. | |
| 5,222,246 A | 6/1993 | Wolkstein | |
| 5,287,069 A * | 2/1994 | Okubo et al. | 330/84 |
| 5,736,898 A | 4/1998 | Kohl et al. | |
| 5,872,491 A | 2/1999 | Kim et al. | |
| 5,880,648 A | 3/1999 | Aves et al. | |
| 5,884,143 A | 3/1999 | Wolkstein et al. | |
| 5,953,811 A | 9/1999 | Mazzochette | |
| 6,046,609 A | 4/2000 | Toyoshima et al. | |
| 6,046,649 A | 4/2000 | Lange | |
| 6,242,984 B1 | 6/2001 | Stones et al. | |
| 6,483,397 B2 | 11/2002 | Catoiu | |
| 6,614,325 B1 | 9/2003 | Kocin | |
| 6,753,807 B1 | 6/2004 | McLaughlin et al. | |
| 6,799,020 B1 | 9/2004 | Heidmann et al. | |
| 6,982,613 B2 | 1/2006 | Wu et al. | |
| 7,012,489 B2 | 3/2006 | Sherrer | |
| 7,113,056 B2 | 9/2006 | Wu et al. | |
| 7,148,772 B2 | 12/2006 | Sherrer et al. | |
| 7,227,428 B2 | 6/2007 | Fukunaga | |
| 7,271,680 B2 | 9/2007 | Hall et al. | |
| 7,312,673 B2 | 12/2007 | Wu et al. | |
| 7,382,212 B2 | 6/2008 | Lo Hine Tong et al. | |

(Continued)

FOREIGN PATENT DOCUMENTS

WO        2012003506        1/2012

OTHER PUBLICATIONS

Written Opinion of the International Searching Authority mailed Jan. 5, 2012 on PCT/US2011/042902.

(Continued)

*Primary Examiner* — Khanh V Nguyen
(74) *Attorney, Agent, or Firm* — Niels Haun; Dann Dorfman Herrell & Skillman, PC

(57) ABSTRACT

A power-combined amplifier and method are provided. In one aspect, the power-combined amplifier and method overcome problems associated with decreased output power efficiency caused by phase mismatch between constituent amplifiers.

26 Claims, 16 Drawing Sheets

(56) References Cited

U.S. PATENT DOCUMENTS

| | | | |
|---|---|---|---|
| 7,385,462 | B1 | 6/2008 | Epp et al. |
| 7,405,638 | B2 | 7/2008 | Sherrer et al. |
| 7,463,109 | B2 | 12/2008 | Ilo |
| 7,482,894 | B2 | 1/2009 | Wu et al. |
| 7,598,805 | B2 * | 10/2009 | Staudinger et al. ....... 330/124 R |
| 7,616,058 | B1 | 11/2009 | Nezakati et al. |
| 7,623,006 | B2 | 11/2009 | Ezzeddine et al. |
| 7,649,432 | B2 | 1/2010 | Sherrer et al. |
| 7,656,256 | B2 | 2/2010 | Houck et al. |
| 7,746,175 | B2 | 6/2010 | Rector |
| 7,755,174 | B2 | 7/2010 | Rollin et al. |
| 7,898,356 | B2 | 3/2011 | Sherrer et al. |
| 7,932,781 | B2 | 4/2011 | Lopez |
| 7,948,335 | B2 | 5/2011 | Sherrer et al. |
| 8,031,037 | B2 | 10/2011 | Sherrer et al. |
| 8,319,583 | B2 | 11/2012 | Huettner |
| 2003/0174018 | A1 * | 9/2003 | Cooper et al. ............ 330/124 R |
| 2005/0174194 | A1 | 8/2005 | Wu et al. |
| 2007/0001907 | A1 | 1/2007 | Hall et al. |
| 2011/0187453 | A1 | 8/2011 | Deckman et al. |
| 2012/0062335 | A1 | 3/2012 | Sherrer et al. |
| 2013/0050055 | A1 | 2/2013 | Paradiso et al. |

OTHER PUBLICATIONS

A Novel Broadband High-Power Combiner, Q Gu et al, 2005 IEEE Asia Pacific Microwave Conference Proceedings.

Comtech EF Data, PCB-4000, 1+1 Phase Combiner Installation and Operation Manual, Revision 2, Oct. 9, 2012. http://www.comtechefdata.com/files/manuals/mn-amplifiers-pdf/mn-pcb4000.pdf.

CPI, Power Amplifier Phase (Power) Combining, Jun. 8, 2005. http://www.ramayes.com/Data%20Files/Communications%20Power%20Industries/CPI%201000-Watt%20Amplifier%20System.pdf.

Chance, G.I. et al., "A suspended-membrane balanced frequency doubler at 200GHz," 29th International Conference on Infrared and Millimeter Waves and Terahertz Electronics, pp. 321-322, Karlsrube, 2004.

Immorlica, Jr., T. et al., "Miniature 3D micro-machined solid state power amplifiers," COMCAS 2008.

Ehsan, N. et al., "Microcoaxial lines for active hybrid-monolithic circuits," 2009 IEEE MTT-S Int. Microwave.Symp. Boston, MA, Jun. 2009.

Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.

Filipovic, D.S., "Design of microfabricated rectangular coaxial lines and components for mm-wave applications," Microwave Review, vol. 12, No. 2, Nov. 2006, pp. 11-16.

Ingram, D.L. et al., "A 427 mW 20% compact W-band InP HEMT MMIC power amplifier," IEEE RFIC Symp. Digest 1999, pp. 95-98.

Lukic, M. et al., "Surface-micromachined dual Ka-band cavity backed patch antennas," IEEE Trans. AtennasPropag., vol. 55, pp. 2107-2110, Jul. 2007.

Oliver, J.M. et al., "A 3-D micromachined W-band cavity backed patch antenna array with integrated rectacoax transition to wave guide," 2009 Proc. IEEE International Microwave Symposium, Boston, MA 2009.

Rollin, J.M. et al., "A membrane planar diode for 200GHz mixing applications," 29th International Conference on Infrared and Millimeter Waves and Terahertz Electronics, pp. 205-206, Karlsrube, 2004.

Rollin, J.M. et al., "Integrated Schottky diode for a sub-harmonic mixer at millimetre wavelengths," 31st International Conference on Infrared and Millimeter Waves and Terahertz Electronics, Paris, 2006.

Saito et al., "Analysis and design of monolithic rectangular coaxial lines for minimum coupling," IEEE Trans. Microwave Theory Tech., vol. 55, pp. 2521-2530, Dec. 2007.

Vanhille, K. et al., "Balanced low-loss Ka-band μ-coaxial hybrids," IEEE MTT-S Dig., Honolulu, Hawaii, Jun. 2007.

Vanhille, K. et al., "Ka-Band surface mount directional coupler fabricated using micro-rectangular coaxial transmission lines," 2008 Proc. IEEE International Microwave Symposium, 2008.

Vanhille, K.J. et al., "Ka-band miniaturized quasi-planar high-Q resonators," IEEE Trans. Microwave Theory Tech., vol. 55, No. 6, pp. 1272-1279, Jun. 2007.

Vyas R. et al., "Liquid Crystal Polymer (LCP): The ultimate solution for low-cost RF flexible electronics and antennas," Antennas and Propagation Society, International Symposium, p. 1729-1732 (2007).

Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.

Wang, H. et al., "Power-amplifier modules covering 70-113 GHz using MMICs," IEEE Trans Microwave Theory and Tech., vol. 39, pp. 9-16, Jan. 2001.

Vanhille, K., "Design and Characterization of Microfabricated Three-Dimensional Millimeter-Wave Components," Dissertation, 2007.

Ehsan, N., "Broadband Microwave Litographic 3D Components," Dissertation 2009.

Colantonio, P., et al., "High Efficiency RF and Microwave Solid State Power Amplifiers," pp. 380-395, 2009.

Palacios, T. et al., "High-power AlGaN/GaN HEMTs for Ka-band applications," IEEE Electron Device Letters 26, No. 11 (2005): 781-783.

York, R.A., et al., "Some considerations for optimal efficiency and low noise is large power combiners," IEEE Transactions on Microwave Theory and Techniques, vol. 49, No. 8, Aug. 2001.

Guannella, G., "Novel Matching Systems for High Frequencies,": Brown-Boveri Review, vol. 31, Sep. 1944, pp. 327-329.

Chen, A.C., "Development of Low-Loss Broad-Band Planar Baluns Using Multilayered Organic Thin Films," IEEE Transactions on Microwave Theory and Techniques, vol. 53, No. 11, pp. 3648-3655, Nov. 2005.

Sherrer, D, Vanhille, K, Rollin, J.M., "PolyStrata Technology: A Disruptive Approach for 3D Microwave Components and Modules," Presentation (Apr. 23, 2010).

Ali Darwish et al.; Three Dimensional Transmission Lines and Power Divider Circuits; 2009 IEEE; pp. 184-190.

Ali Darwish et al.; Vertical Balun and Wilkinson Divider; 2002 IEEE MTT-S Digest; pp. 109-112. 2002.

Anthony A. Immorlica, Jr., et al., Miniature 3D Micro-Machined Solid State Power Amplifiers; Distribution Statement "A" (Approved for Public Release, Distribution Unlimited) N/A., Apr. 4, 2008.

Written Opinion of the International Searching Authority mailed Jan. 5, 2012 on PCT/US2011/042902. Jan. 5, 2012.

Saito, Y., Fontaine, D., Rollin, J-M., Filipovic, D., "Micro-Coaxial Ka-Band Gysel Power Dividers," Microwave Opt Technol Lett 52: 474-478, 2010, Feb. 2010.

Dong, Y., et al., "60 GHz Low Loss, Amplitude and Phase Balanced Radial Waveguide Power Combiner", International Conference on Communications and Control, Sep. 9-11, 2011, pp. 4077-4073.

Vanhille, K., et al., "A Capacitively-Loaded Quasi-Planar Ka-Band Resonator", 36th European Microwave Conference, Sep. 10-15, 2006.

Vanhille, K., et al., "Quasi-Planar High-Q Millimeter Wave Resonators", IEEE Transactions on Microwave Theory and Techniques, Jun. 2006.

Extended EP Search Report for EP Application No. 11801527.0 dated Oct. 13, 2014.

* cited by examiner

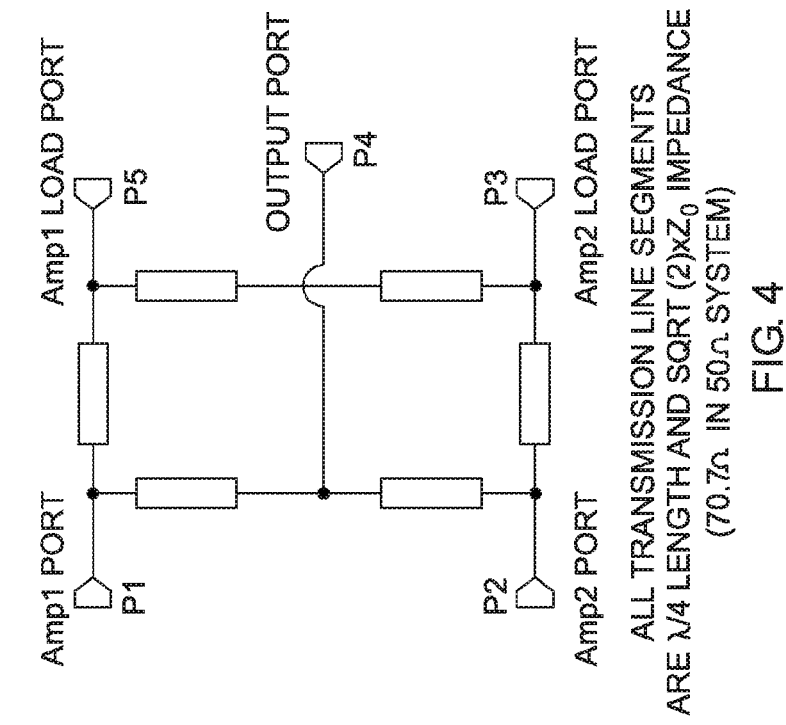

SMART POWER COMBINER

GOVERNMENT LICENSE RIGHTS

This invention was made with government support under contract numbers FA9453-11-M-0062 and FA9453-12-C-0096 awarded by the Air Force Research Laboratory. The government has certain rights in the invention.

FIELD OF THE INVENTION

The present invention relates generally to improving the performance of power-combined amplifiers, and more particularly but not exclusively to improving the performance of power-combined solid-state power amplifiers (SSPAs) and vacuum electronics-based amplifiers.

BACKGROUND OF THE INVENTION

Power-combined amplifiers use a variety of technologies, including vacuum tube amplifiers such as traveling wave tubes, and solid-state amplifiers realized in GaAs, GaN, InP, SiGe, and silicon CMOS processes. There is a broad need for the ability to sense and correct transmission phases in combined amplifiers, because normal phase variations in unit amplifiers can degrade overall efficiency as some portion of the signal that should coherently combine at the power amplifier output is dissipated in isolation resistors. (Conservation of energy demands that dissipation in isolation resistors is subtracted from the potential output power of the amplifier, thus degrading overall efficiency.)

"Phase efficiency" in a power-combined amplifier is approximately related to RMS phase error between constituent amplifiers as:

$$\eta\text{phase} = \cos^2(\phi_{RMS}). \quad (1)$$

FIG. 2 shows the effect on efficiency when the RMS phase error between amplifiers is considered in an N-way combiner following Eq. 1. In the case of a two-way divider, RMS error is equal to one-half the full error between the two signals (if they are 90 degrees out of phase, RMS error is 45 degrees). For example, if two amplifiers were combined that are 40 degrees apart in phase (20 degrees RMS), the phase efficiency would be 88.3% according to Eqn. 3. This means that without considering combiner real loss, combining two power amplifiers that have 40% power-added efficiency (PAE) but are 40 degrees apart, would lead to an output signal that is reduced to 88.3% of its ideal value (power is reduced by −0.54 dB) and 40% PAE amplifiers would be reduced to 35.3%. The missing power is converted to heat in the combiner's isolation resistors, which must be properly sized to handle the expected worst-case wasted power for reliable operation. Clearly it is undesirable to lose any efficiency points in this manner. A solution might be to line up all amplifiers in an N-way combiner to fit within an 11.5-degree window, ensuring that RMS effort is less than 5.7 degrees. Under this condition, 1% would be the maximum performance lost and phase efficiency would exceed 99%.

For reference, RMS error is defined as:

$$\varphi_{RMS} = \sqrt{\sum_{1}^{N} \frac{(\varphi_i - \bar{\varphi})^2}{N}}, \quad (2)$$

where phase angles are typically expressed in degrees.

Prior attempts to solve the phase mismatch problem in power-combined amplifiers include binning component amplifiers into transmission phase windows based on measurements. However, in solid-state power amplifiers, for example, often only small-signal data is known prior to assembling the amplifier, and small-signal phase may be different from large-signal phase. Furthermore, amplifiers can change over time and temperature. Thus, a solution provided at initial device fabrication may fail or unacceptably degrade later with amplifier change. Also, effects of interconnects must be considered, including wirebonds and non-ideal phase performance of divider and combiner. Enforcing narrow phase bins on a widely varying but finite population of amplifier chips can force undesirable compromises in phase alignment, particularly during a rework event where an amplifier chip must be replaced using "leftover" amplifiers.

In contrast, phase trim has been used with vacuum-tube amplifiers to adjust phases of individual component amplifiers, in-situ, during large signal operation. The loss of the phase trim circuit is not important, as it is configured on the input side of the individual amplifiers. In such a case, the phase shifter is set to maximize the ratio of output power to wasted power, or minimize the wasted power for a fixed input power, through trial and error. A mechanical adjustment is used, and it is recommended that the adjustment be made at the factory. Further, the amplifier must be taken off-line to evaluate the phase mismatch.

In a similar manner, power sensing may be performed using isolation loads on hybrid couplers which include 90-degree hybrids and 180-degree hybrids; however, schemes such as these are not ideal and provide only one sense for every pair of amplifiers. One sense for two amplifiers can indicate the magnitude of the phase mismatch but not the direction (positive or negative) of the mismatch. Consequently using this type of power sensing for phase correction results in an iterative solution. In addition, hybrid couplers are generally not applicable to direct N-way combiners.

While it is theoretically possible to perform power sensing across the isolation resistor in a Wilkinson power divider, decoupling the DC signal from the RF at this most-sensitive node in the combiner is a tricky endeavor, which would result in reduced power combining efficiency due to common-mode loading. Schemes have been introduced that decouple the Wilkinson resistor to a one-port network using balun structures at the expense of bandwidth and complexity. Thus, it would be an advance in the art to overcome the above noted deficiencies in power-combined amplifiers.

SUMMARY OF THE INVENTION

In one of its aspects, the present invention provides a power-combined amplifier which may include first and second constituent amplifiers each having a respective power output and a power combiner electrically connected to the power outputs of the first and second constituent amplifiers. The power combiner may include an output configured to the deliver combined power outputs of the constituent amplifiers and may include a respective isolated termination for each of the first and second constituent amplifiers. At least one detector may be operably connected to the isolated terminations of the first and second constituent amplifiers and configured to measure a load excitation at each of the isolated terminations. Additionally, the power-combined amplifier may include a controller operably connected to the at least one detector to receive the measured load excitations of the first and second constituent amplifiers. The controller may be configured to analyze the measured load excitations and determine a phase mismatch between the first and second constituent amplifiers. For example, the controller may be configured to determine the frequency of a load excitation null at the respective power output of each of the first and second constituent amplifiers. The controller may also be configured to determine the phase difference between the first and second constituent amplifiers from the respective determined frequencies of the load excitation nulls of the first and second constituent amplifiers. Further, the power-combined amplifier may include a phase shifter in electrical communication with an input of the first constituent amplifier, and the phase shifter may be operably connected to the controller. The controller in turn may be configured to communicate a signal to the phase shifter to correct the phase mismatch between the first and second constituent amplifiers.

In another of its aspects, the present invention provides a method for combining power outputs of constituent amplifiers with phase matching, which may comprise combining the power outputs of first and second constituent amplifiers; determining the frequency of a load excitation null at the respective power output of each of the first and second constituent amplifiers; determining the phase difference between the first and second constituent amplifiers from the respective determined frequencies of the load excitation nulls of the first and second constituent amplifiers; and applying a phase correction related to the determined phase difference to at least one of the first and second constituent amplifiers to decrease phase mismatch between the first and second constituent amplifiers. The step of applying a phase correction may include providing a controller operably connected to at least one of the first and second constituent amplifiers, where the controller provides the phase correction to at least one of the first and second constituent amplifiers to decrease phase mismatch between the first and second constituent amplifiers.

In yet another of its aspects, the present invention provides a power amplification device having a monitored power output. The power amplification device may include a power amplifier having a power output and a shunt coupler in electrical communication with the power output. The shunt coupler may include a high-impedance quarter-wave line configured to shunt the power output to ground and may include a port tapped-off proximate to the ground. The power amplification device may also include a detector in electrical communication with the port and configured to detect the power at the power output of the power amplifier.

In a still further aspect of the present invention, a power-combined amplifier may be provided comprising N constituent amplifiers each having a respective power input and power output, where N is three or more. A power combiner may be electrically connected to the power outputs of the N constituent amplifiers and may be configured to deliver the combined power outputs of the constituent amplifiers. In addition, a plurality of reflection-phase correction lines may be provided with each of the lines electrically connected to the power input or power output of a respective constituent amplifier, where the reflection-phase correction lines may be selected from the values of the set $$\left\{ x \cdot \frac{180°}{N} \,\middle|\, x \in I, 1 \leq x \leq N-1 \right\}.$$

A total of 2·(N−1) lines may be selected from the set. The selection may be made such that when a selected first of the plurality of reflection-phase correction lines is electrically connected to the input of a selected constituent amplifier, and a selected second of the plurality of reflection-phase correction lines is electrically connected to the output of the selected constituent amplifier, the sum of the values of the selected first and second lines is $$(N-1) \cdot \frac{180°}{N}.$$

In yet another aspect, the present invention may provide a power-combined amplifier, comprising N constituent amplifiers each having a respective power input and power output, where N is an even number greater than two, and the N constituent amplifiers are composed of first and second groups of N/2 amplifiers. A power splitter having a power input and N power outputs may be provided with each splitter output electrically connected to the power input of a respective constituent amplifier. A power combiner may be electrically connected to the power outputs of the N constituent amplifiers, and may be configured to deliver the combined power outputs of the constituent amplifiers. N 90° reflection-phase correction lines may be provided with half disposed in electrical communication with the power input of a respective constituent amplifier of the first group and half disposed in electrical communication with the power output of a respective constituent amplifier of the second group.

Among the benefits and advantages afforded by the devices and methods of the present invention is a solution to the problem of sensing out-of-phase conditions in power-combined power amplifiers, for N-way direct combiners as well as N-way corporate combiners. The solution provided by the present invention can provide a direct measurement of phase value differences (including sign) between all constituent amplifiers. In so doing, the present invention eliminates guesswork in achieving phase shift correction settings to align amplifiers to within the phase tolerances of the phase shifters used to impart the correction. The phase control/correction can be operated manually or be implemented using sophisticated electronics, which can be resident on a phase shifter integrated circuit. In addition, devices and methods of the present invention can detect which amplifier(s) is at fault during a soft failure in an N-way combiner, and can provide information on load dissipation, which can be used to shut down the circuit if it is in danger of damage.

In addition, in exemplary configurations, the present invention may use load/detectors employing semiconductor diodes for near-instantaneous and accurate power sensing, which is not be the case in prior devices where thermistors, resistance temperature detectors (RTDs) or thermocouples are used to sense temperature changes caused by load heating. Exemplary configurations can also provide a "free" home for placing isolation load/detectors, by monolithically integrating the load/detectors with power amplifiers so the benefits of phase sensing are economical and compact. Still further, in another of its aspects, the present invention provides a compact output coupler with near-zero insertion loss for high-power-indicate function, as well as quadrature or poly-phase operation using appropriate transmission line segments to reduce input and output reflection coefficients.

BRIEF DESCRIPTION OF THE DRAWINGS

The foregoing summary and the following detailed description of the preferred embodiments of the present invention may be further understood when read in conjunction with the appended drawings, in which:

FIG. 3 schematically illustrates a two-way Gysel-combined power amplifier model with ports to measure load excitations in accordance with the present invention;

FIG. 4 schematically illustrates the two-way Gysel combiner port definitions for the model of FIG. 3;

DETAILED DESCRIPTION OF THE INVENTION

Figure 1A:
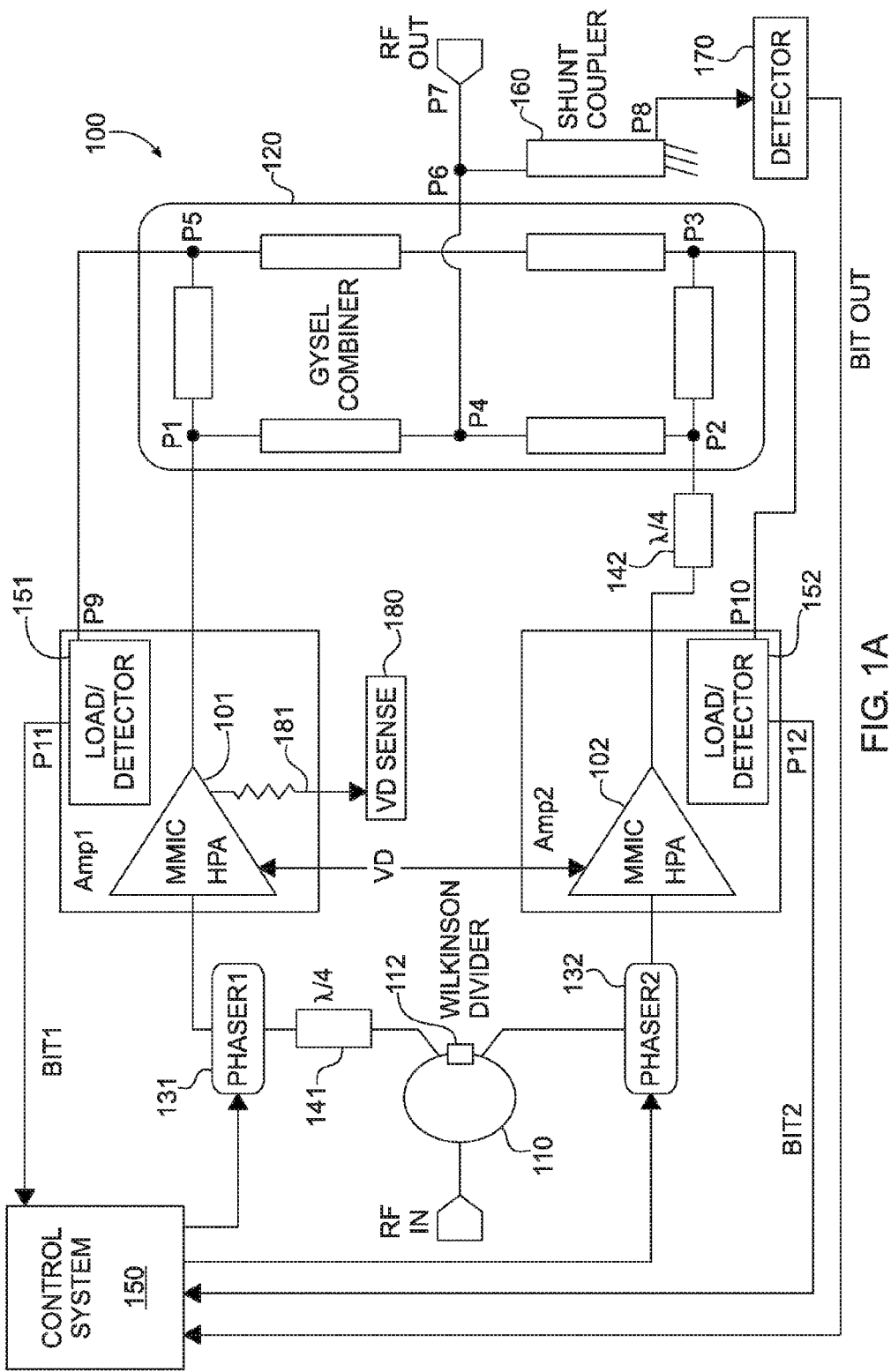
FIG. 1A schematically illustrates an exemplary configuration of a smart power combiner in accordance with the present invention exemplified as a two-way solid-state circuit.

Referring now to the figures, wherein like elements are numbered alike throughout, FIG. 1A illustrates an exemplary smart power combiner 100 in accordance with the present invention which overcomes problems associated with decreased output power efficiency caused by phase mismatch between constituent amplifiers 101, 102. In one of its aspects, the devices and methods of the present invention make use of a discovery by the applicant that the magnitude and sign of the relative phase error between constituent amplifiers 101, 102 can be determined by analysis of the frequency response of load excitations of the constituent amplifiers 101, 102. That is, by measuring the excitations of at load/detectors 151, 152 relative to amplifier output power against frequency, applicant has discovered that it is possible to determine the relative phase error, if any, between the constituent amplifiers 101, 102 and to use such information to correct it. In this regard, the excitations at the load/detectors 151, 152 may be analyzed by a control system 150 to determine the relative phase error between the constituent amplifiers 101, 102. The control system 150 may then use the determined relative phase error between the constituent amplifiers 101, 102 to drive one or more phase shifters 131, 132 to apply a phase shift correction to the constituent amplifiers 101, 102 to substantially minimize or eliminate the phase error between the amplifiers 101, 102 and thereby increase the phase efficiency of the smart power combiner 100. In addition to phase correction, the present invention also provides improved device performance in the areas of quadrature operation, load termination, output power monitoring, and drain voltage sense monitoring.

A better understanding of the principles of operation of smart power combiners of the present invention and discoveries related thereto may be had by considering the effects of phase mismatch between constituent amplifiers 301, 302 on power output in a canonical two-way power-combined amplifier 300 in which two ideal amplifiers 301, 302 are combined, FIG. 3. The transmission phase of the first amplifier 301 will be denoted $\phi_1$, and the transmission phase of the second amplifier 302 will be denoted $\phi_2$. The power-combined amplifier 300 may include a splitter 310 which receives an input signal, RF In, and divides the input signal for delivery to the two constituent amplifiers 301, 302. The splitter 310 may be a Wilkinson splitter, but other types of splitters could be used. The outputs of the constituent amplifiers 301, 302 may be coupled to and combined by a combiner 320, which may be provided in the form of a two-way Gysel network having an isolated termination for each constituent amplifier 301, 302. A modified Gysel in which each amplifier has at least one isolated load port would be suitable as well.

Matched ports, PORT3, PORT4, of 100 ohms may be added to the Gysel isolation loads so that excitation of each load relative to a respective input signal can be evaluated. One hundred ohms is the correct termination value when the Gysel ring is uniformly 70.7 ohms impedance which is used in this example, the possibilities for changing load and transmission line segment impedances are well known. The ports, PORT3, PORT5, may include other impedances such as fifty ohms to facilitate desired system requirements. For purposes of the present analysis, the amplifiers 301, 302 may be modeled to have zero gain so that the power sensed at the isolation loads at PORT3, PORT4 is relative to the amplifier output power as well as amplifier input power. FIG. 4 schematically illustrates the Gysel combiner 320 and port definitions of the two-way power-combined amplifier 300 of FIG. 3. In this model, the isolated load port P1 of amplifier 301 is closest to amplifier 301, and the isolated load port P2 of amplifier 302 is closest to amplifier 302. The output port P4 has been configured on the right so that the overall circuit has the same port configuration as the two-way Gysel power combiner 320 in FIG. 3. The quarter-wave segments are shown to be 70.7 ohms uniformly, this is but one example of a Gysel combiner, and other impedances are possible for a given system impedance.

Figure 5:
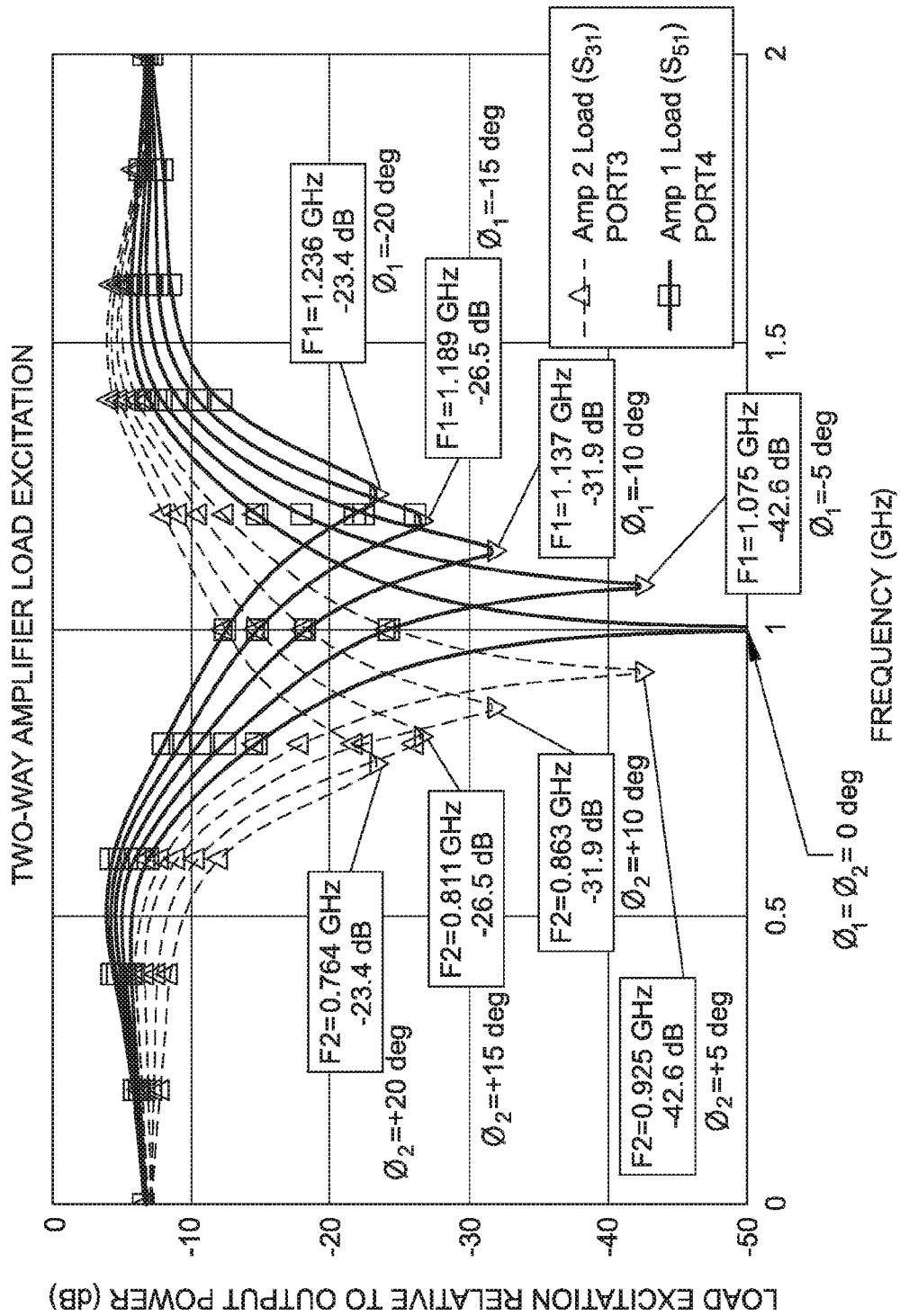
FIG. 5 illustrates the two-way load excitation of the model of FIG. 3 for swept phase difference 0 to 40 degrees in 10 degree increments.

To illustrate the effect of phase mismatch between the amplifiers 301, 302 on the power output of the two-way power-combined amplifier 300, a mathematical simulation was conducted in which the phase angle between the amplifiers 301, 302 was swept from 0 to 40 degrees in 10-degree increments (one amplifier 302 was swept 0, +5, +10, +15, +20 degrees while the other amplifier 301 was swept 0, −5, −10, −15, −20 degrees). The resulting load excitations relative to amplifier output power (dB) versus frequency (GHz) are plotted in FIG. 5. When the amplifiers 301, 302 are perfectly in phase the excitation curves are on top of each other with a deep null at the center frequency (1 GHz) for this 1 GHz-normalized device and none of the RF power is dissipated in either load. However, when the phases of the amplifiers 301, 302 are 10 degrees apart the minima move to 0.925 and 1.075 GHz, respectively. As the phase angle between the amplifiers 301, 302 is increased, the minima move further apart in frequency. The amplifier that has its dip at the higher frequency, e.g., amplifier 301 in this example, has the most negative phase angle. As a convenient convention, the amplifier that is farthest to the right, i.e., amplifier 301, is termed the reference amplifier. Using the convention that phase shifter states are increasingly negative, the amplifier, e.g., amplifier 302, with load excitation characteristic dip to the left can be phase-aligned to the reference amplifier (i.e., amplifier 301) by increasing its phase shift (making amplifier 302 more negative in phase).

Figure 6:
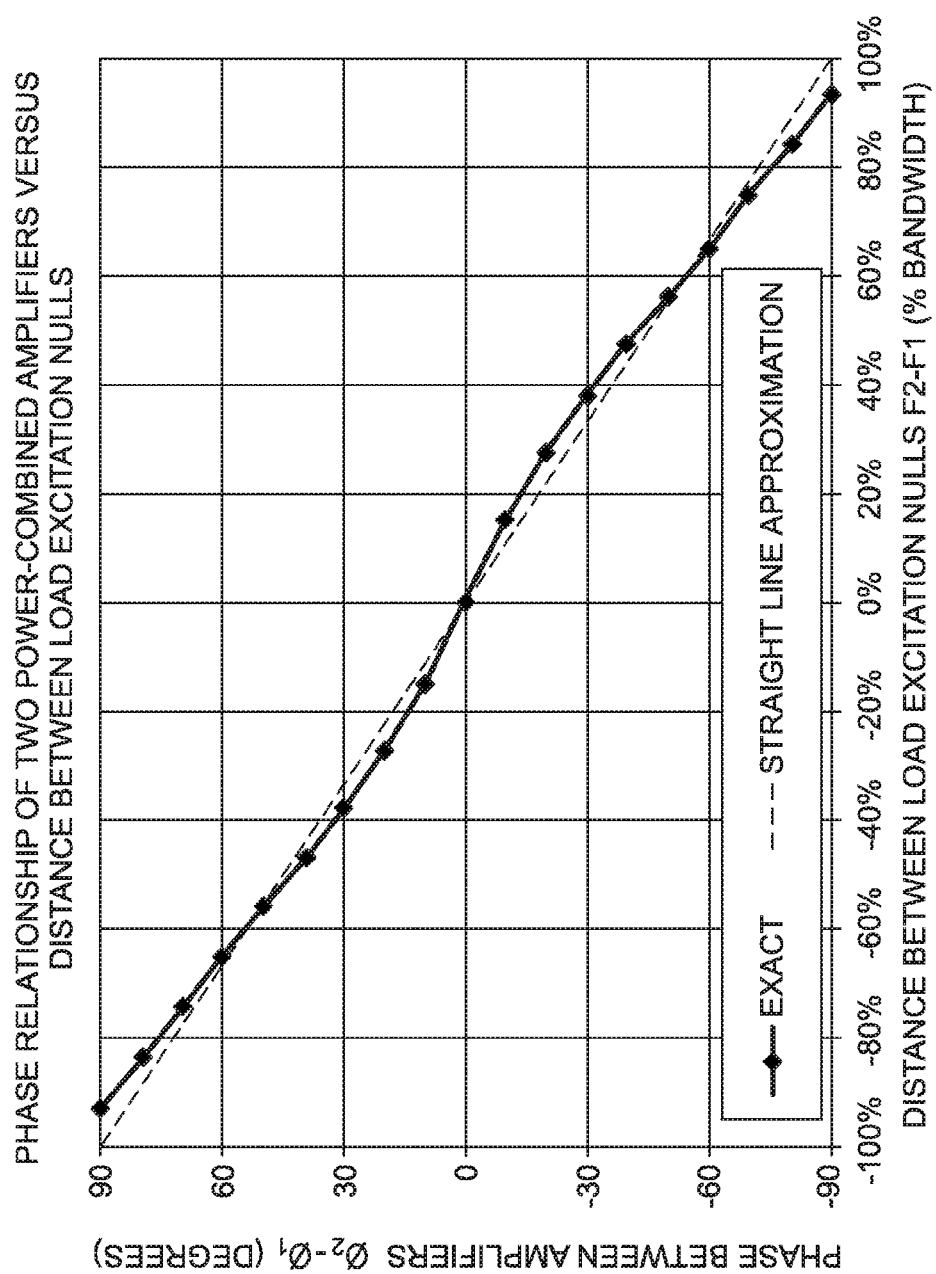
FIG. 6 illustrates the relationship between isolation null relative positions to relative phase angle of the two-way amplifier model of FIG. 3.

Varying the phase between the amplifiers 301, 302 over the range from +/−90 degrees and plotting the frequency distance of the load excitation minima versus phase difference results in the plot shown in FIG. 6. Here, $\phi 2-\phi 1$ is the phase of amplifier 301 subtracted from the phase of amplifier 302, and F2-F1 is the frequency of the load excitation null of amplifier 301 subtracted from the frequency of the load excitation null of amplifier 302 expressed as a percentage of bandwidth. As a result of this analysis, the response was found empirically to be a nearly-linear relationship, in which each 10% difference in frequency represents approximately −9 degrees in phase shift between the two amplifiers 301, 302, or −90 degrees/100% bandwidth, i.e.:

$$\Delta\phi = -0.9 \, \Delta F, \quad (3)$$

where $\Delta\phi$ is the transmission phase difference between amplifiers measured in degrees and $\Delta F$ is the frequency difference in load excitation nulls measured as a percentage bandwidth. The straight-line approximation of Eqn. 3 illustrated in FIG. 6 shows that there may be significant errors associated with the linear approximation. For example, at $\Delta F=15\%$ the exact phase difference is −10 degrees instead of 13.5 degrees predicted by the straight-line method. Therefore a more exact curve fit of the relationship may be helpful in phase aligning an amplifier, unless an iterative process can be employed.

In addition, the relative phase of the two amplifiers 301, 302 is also revealed: when $\phi 2-\phi 1$ is positive, F2−F1 will be negative, and vice-versa. Thus, it is known which amplifier 301, 302 leads and which one lags. Thus, in accordance with the present invention, a single frequency sweep of the two load excitations is all that is required to determine $\Delta F$, from which $\Delta\phi$ may be determined to enable phase-alignment of the two-way power-combined amplifier 300. The calculated phase correction may be delivered to the amplifiers 301, 302 through phase shifters added to the input of amplifiers 301, 302. Moreover, applicant has discovered that the relationship of Eqn. 3 and FIG. 6 applies equally well to and N-way power combiner, not just a two-way power combiner 300.

Figure 2:
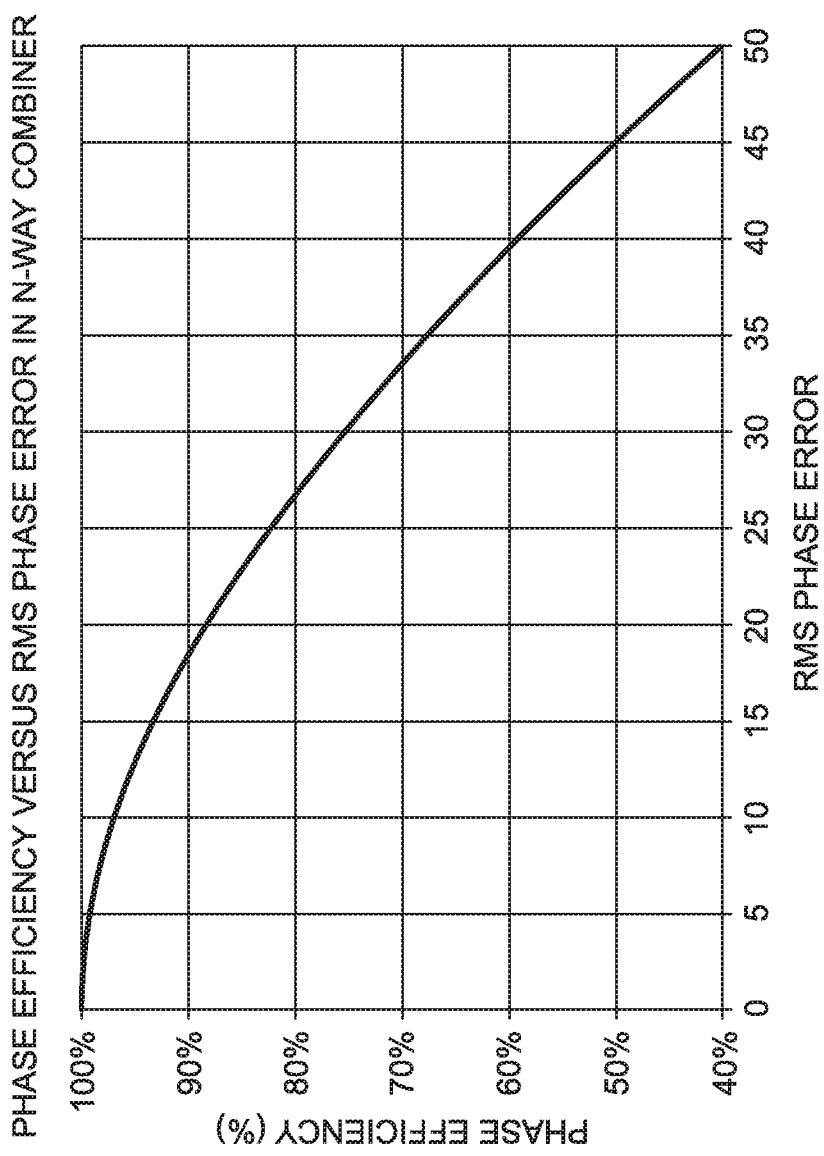
FIG. 2 illustrates the phase error effect on phase efficiency for an N-way combined amplifier.
Figure 8:
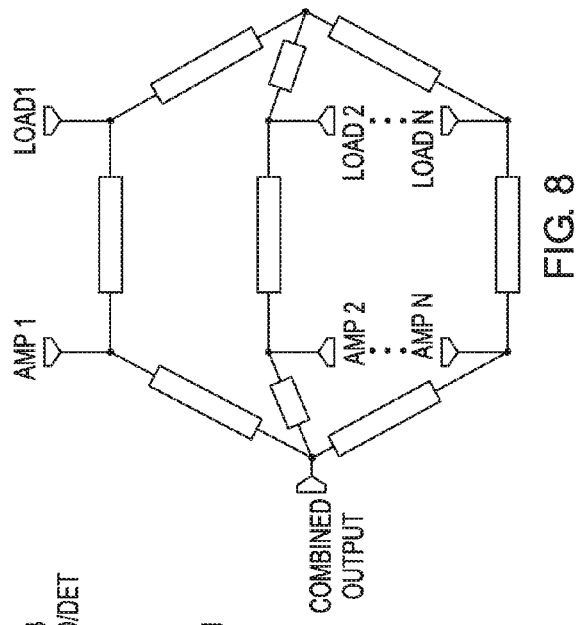
FIG. 8 schematically illustrates the port definitions for an N-way combiner, with the loads numbered according to the amplifiers with which they share an arm.
Figure 7:
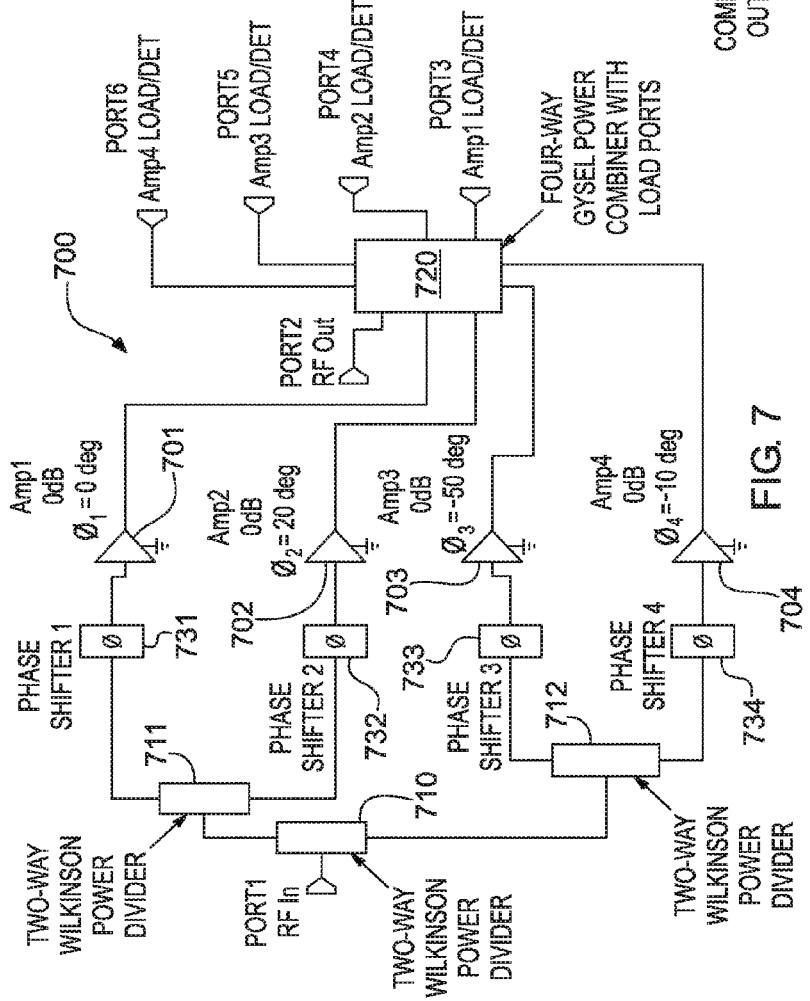
FIG. 7 schematically illustrates a four-way Gysel-combined power amplifier model with ports at each isolation load in accordance with the present invention.

For example, four constituent amplifiers 701, 702, 703, 704 with phases at 0, 20, −50 and −10 degrees, respectively, may be combined with a direct, four-way Gysel 720 to provide a four-way combined power amplifier 700, FIG. 7, with corresponding port definitions as shown in FIG. 8. A plurality of splitters 710, 711, 712 may be provided to divide the input signal, RF In, for delivery to the constituent amplifiers 701-704. Using the convention that sets the amplifier with the greatest negative phase, amplifier 703, as the reference amplifier, the relative phases of the remaining amplifiers are +40 for amplifier 704, +50 for amplifier 701, and +70 degrees for amplifier 702. The relative phases represent an RMS phase error of 25.5 degrees according to Eqn. 2, resulting in phase efficiency of 81.7% according to Eqn. 1, FIG. 2. Under this condition, approximately 1 dB of available output power is lost to the four isolation loads, PORT5-PORT 6.

Figure 9:
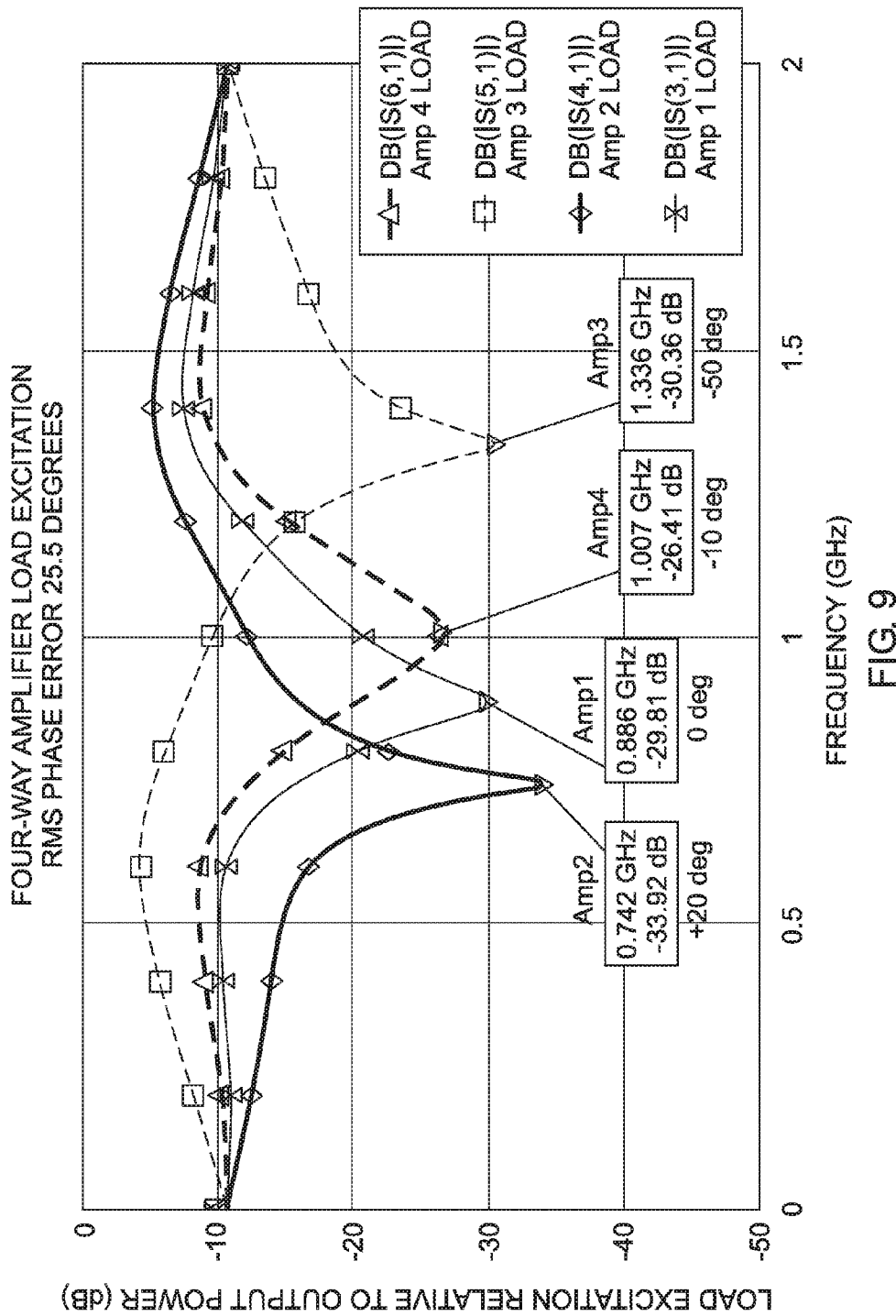
FIG. 9 illustrates load excitations relative to output power of the unaligned four-way amplifier of FIG. 7.

Considering the effect of the phase errors among amplifiers 701-704 in more detail, FIG. 9 illustrates the load excitations where the four-way combined power amplifier 700 is out of phase by 25.5 degrees RMS due to the enumerated phase errors in the individual amplifiers 701-704. The null in the load excitation of the third amplifier 703 is highest in frequency, because it is the most negative in transmission phase angle, i.e., −50 degrees. The load excitation nulls of the other amplifiers 701, 702, 704 decrease in frequency following their relative phase differences from the third amplifier 703. However, the relationship established in FIG. 6 and Eqn. 3 for a two-way combined power amplifier 300 is also generally followed in the four-way combined power amplifier 700.

Using Eqn. 3 to calculate the phase relationships ($\Delta\phi$) between the three amplifiers 704, 701, 702 relative to amplifier 703 based on the frequency difference of the load excitation nulls ($\Delta F$), $\Delta\phi$ is calculated to be 30, 40 and 54 degrees, respectively. By comparison, the actual values of $\Delta\phi$ are known by this simulation to be 40, 50 and 70 degrees, which demonstrates the error present in the approximation of Eqn. 3. Thus, if one were to measure the frequency difference of the load excitation nulls ($\Delta F$) at PORT5-PORT6, one can use Eqn. 3 to determine the approximate phase correction (30, 40 and 54 degrees) to be applied to each amplifier 701-704 without knowledge of the actual relative phase error (40, 50 and 70 degrees) present between the amplifiers 701-704.

In one exemplary configuration, the calculated phase correction may be delivered to each amplifier 701-704 via phase shifters 731, 732, 733, 734 provided at the inputs of amplifier 701-704, respectively. However, other suitable ways to integrate phase control into the power combiner systems of the present invention may be used. For instance, phase shifters can be mechanically or electrically adjustable, in either continuous or discrete steps. Moreover, since one amplifier, e.g., amplifier 703, may be deemed the reference amplifier to which the remaining N−1 amplifiers are matched, phase correction may be provided only to the remaining three amplifiers 704, 701, 702 to match their respective phases to that of the reference amplifier 703. Following the linear correction model of Eqn. 3, the phase of amplifier 701 may be made more negative by 40 degrees by phase shifter 731, the phase of amplifier 702 may be made more negative by 54 degrees by phase shifter 732, and the phase of amplifier 704 may be made more negative by 30 degrees by phase shifter 734.

Figure 10:
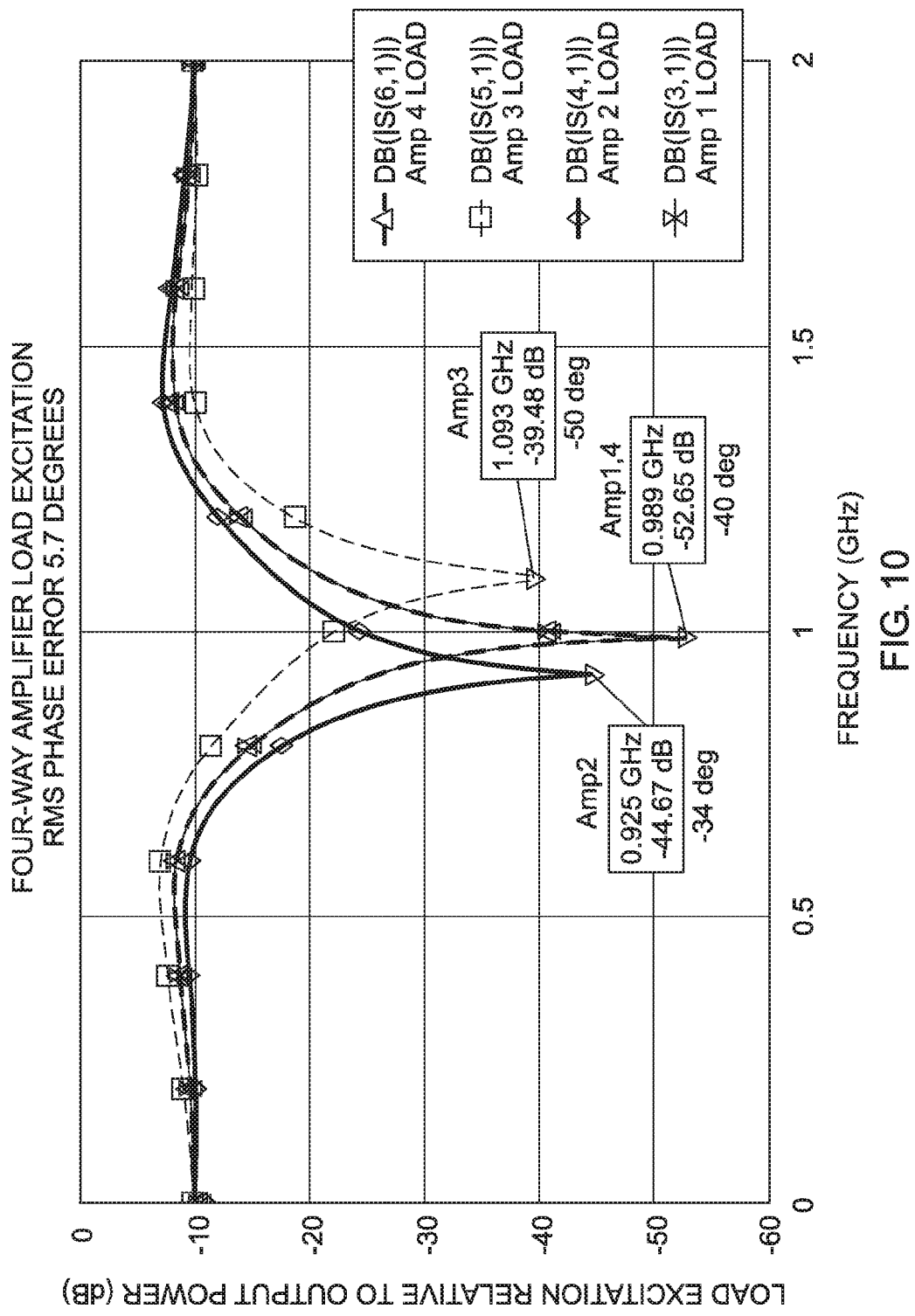
FIG. 10 illustrates load excitations relative to output power of the four-way amplifier of FIG. 7 after a first correction.
Figure 11:
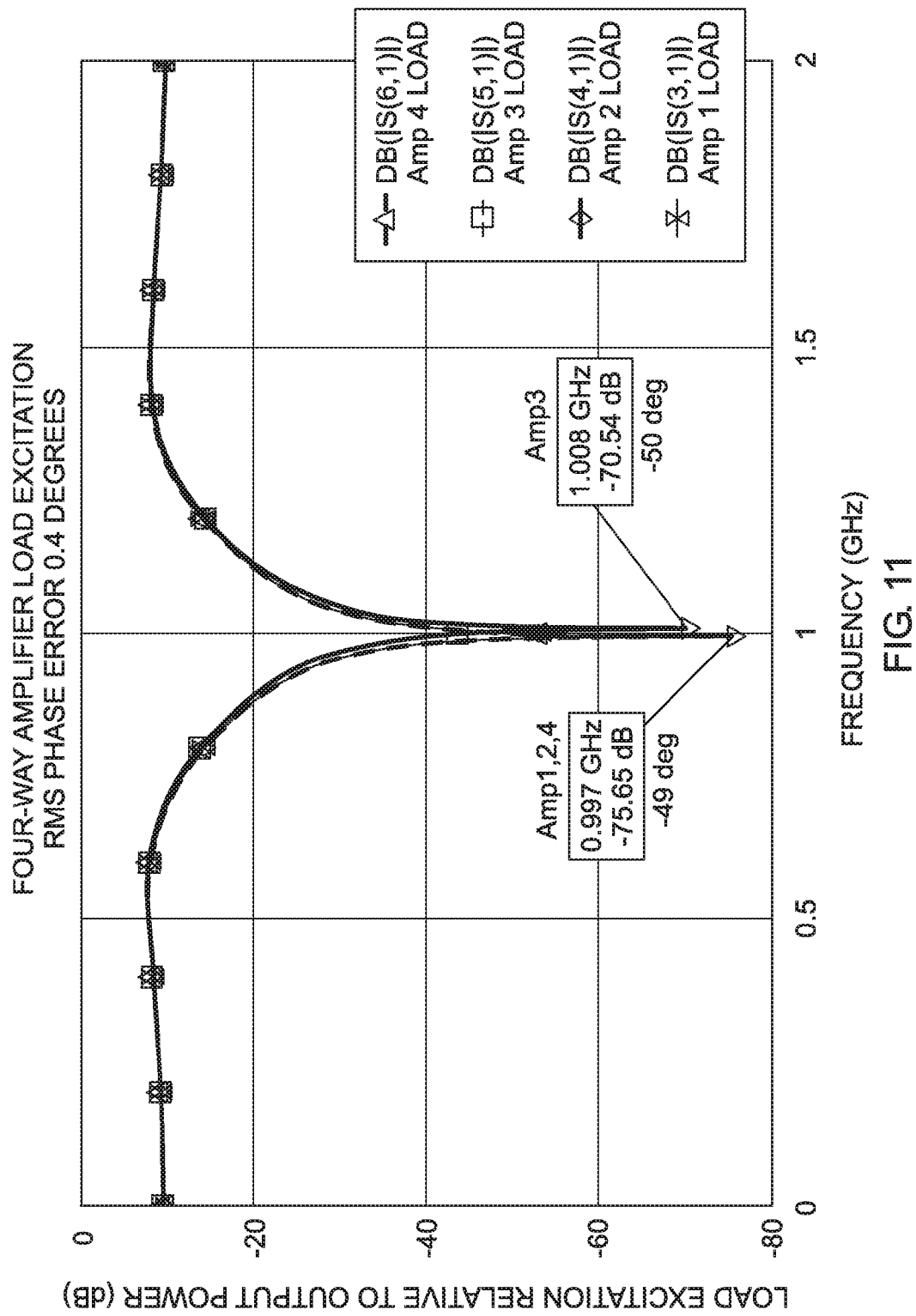
FIG. 11 illustrates load excitations relative to output power of the four-way amplifier of FIG. 7 after a second correction.

In FIG. 10 the resulting load excitations from the simulation are plotted. Despite the error introduced by the approximation of Eqn. 3, after one correction, the phases of the amplifiers 701-704 are much closer to one another at −40, −34, −50, −40 degrees. These phases represent 5.7 degrees RMS phase error according to Eqn. 2, and provide 99.0% phase efficiency per Eqn. 1, FIG. 2, which is stellar performance for any power-combined amplifier. Thus, in this simulation an N-way amplifier 700 has been largely phase-corrected after a single frequency sweep revealed the phase relationships of the constituent amplifiers 701-704, using a simple approximation of the phase behavior. However, the phase correction accuracy can be further increased by a second iteration correction. Specifically, the linear model of Eqn. 3 may be employed a second time. Using the data in FIG. 10 as the starting point, the predicted phase to align amplifiers 701, 704 is 9 degrees, while the predicted phase to align amplifier 702 is 15 degrees. The resulting load excitations after the second correction is shown in FIG. 11. After two corrections, the phases are: −49, −49, −50 and −49 degrees, which represents 0.4 degrees RMS phase error according to Eqn. 2 and 99.99% phase efficiency according to Eqn. 1. Such a fine level of correction would require continuously-variable phase shifters, for example, using varactors to achieve phase shift. When digital phase correction is used there will be quantization error consistent with the lease significant bit.

Thus, phases of N-way combined amplifiers may be conveniently and rapidly corrected using the above-described models. In contrast, existing methods of phase alignment applied to N-way combined amplifiers would take many iterations to converge, as a form of gradient or random optimization would be required, and the result could potentially fail to fully maximize power as local maxima may exist.

Figure 12:
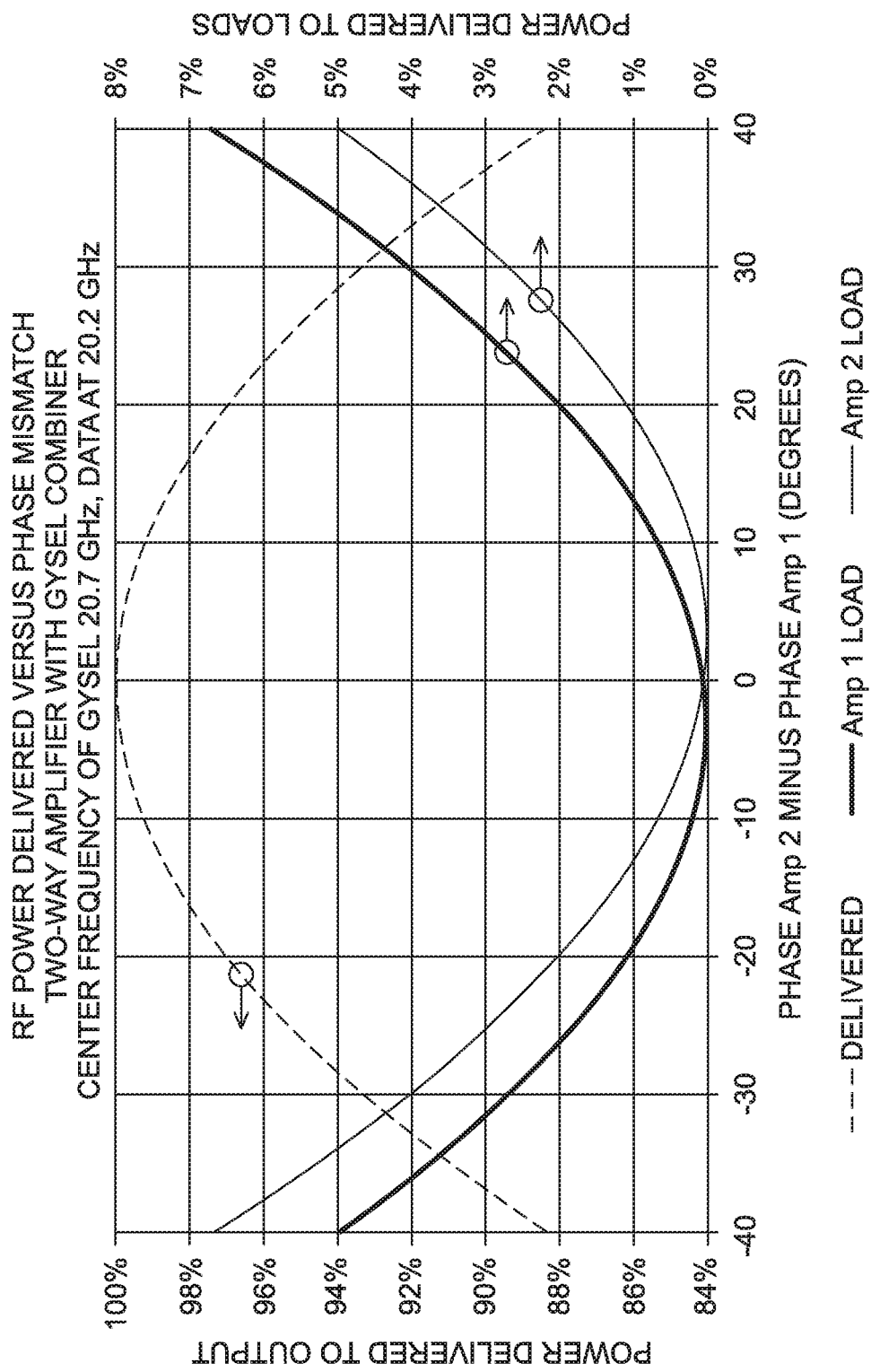
FIG. 12 illustrates the delivered power versus phase mismatch at the output and both loads.

In another aspect of the present invention, it is also possible to make phase corrections from a single frequency point measurement, instead of a frequency sweep, as illustrated in FIG. 12. Here a two-way combined power amplifier of the type shown in FIG. 3 was designed at a center frequency of 20.7 GHz, and the power delivered to the two loads was examined at a single frequency point of 20.2 GHz (0.5 GHz, or 2.4% below the band center), while sweeping phase misalignment ($\Delta\phi$) between amplifiers. The phase of the first amplifier, Amp1, was subtracted from the phase of the second amplifier, Amp2. By using a lookup table or curve fit in accordance with the data in FIG. 6, for example, relative powers can be located on the curves and the phase difference (X-axis) pinpointed. For example, if the Amp1 load was found to be dissipating 2% of available power and the Amp2 load was dissipating 1%, the phase of Amp1 would be 20 degrees more negative than the phase of Amp2. The dashed curve in FIG. 12 represents the percentage of power delivered to the load. When the phases are aligned ($\Delta\phi$=0) 100% of available power is delivered, when phases are misaligned by +11 or −11 degrees, 99% of power is delivered, etc.

Figure 13:
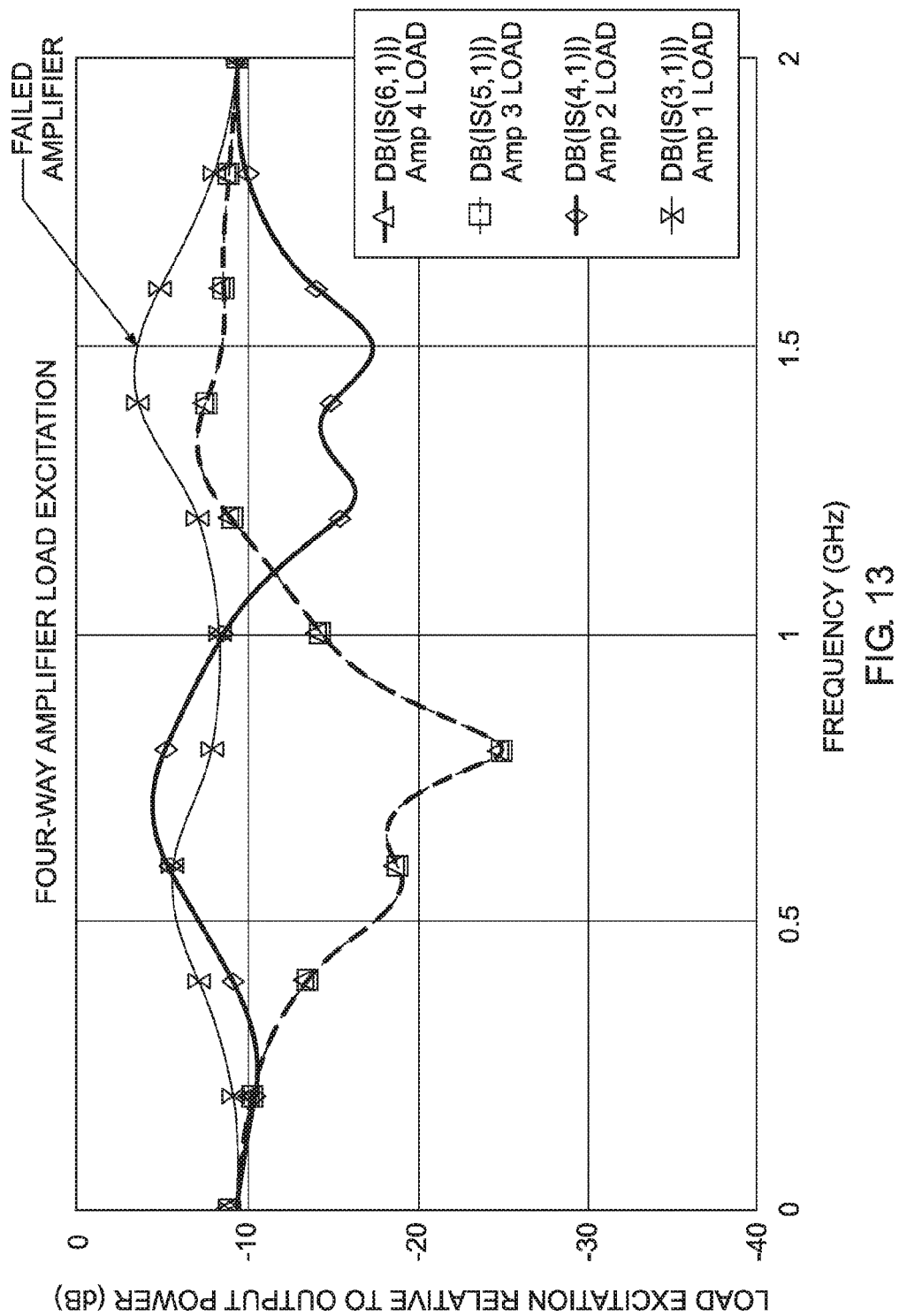
FIG. 13 illustrates the four-way amplifier load excitations when one amplifier has failed.
Figure 14A:
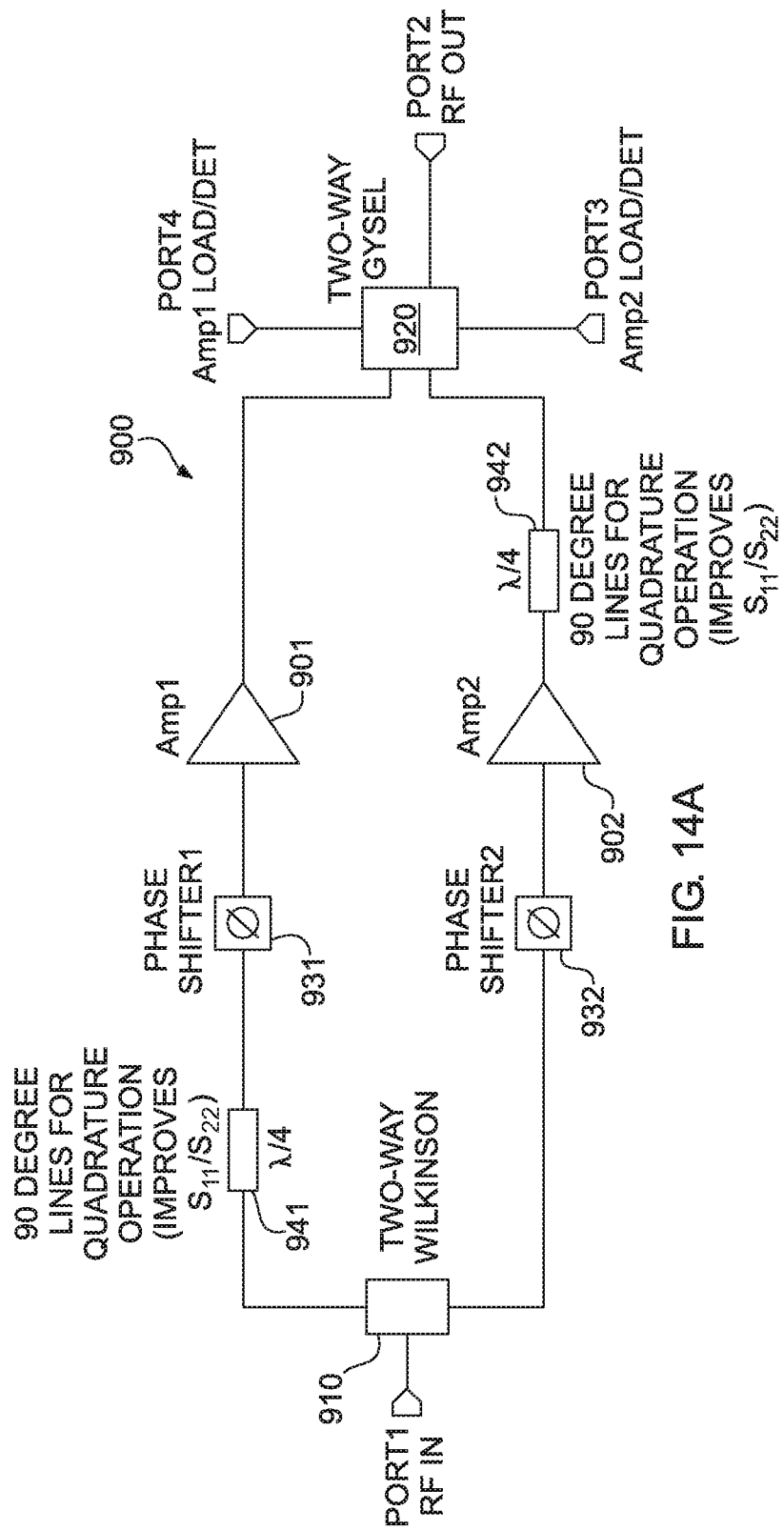
FIG. 14A schematically illustrates quadrature operation of a two-way Gysel combiner in accordance with the present invention.

In yet another aspect of the smart power combiner system of the present invention, a determination can be made of which amplifier is to blame in event of a failure. FIG. 13 shows the load excitation of a four-way combined amplifier, such as that shown in FIG. 7, when the amplifier 701 has failed. The frequency response characteristic of load 1 excitation has a double-humped response of similar magnitude versus frequency, with one hump below center frequency, i.e., 1 GHz, and one above center frequency. By identifying this signature characteristic at any of the loads, the failed amplifier may be quickly determined Quadrature or Poly-Phase Operation of Smart Power Combiner For all of its advantages of providing isolated loads for each power amplifier, the Gysel is an in-phase combiner. Quadrature or poly-phase operation are desirable particularly in situations where constituent amplifiers have poor reflection coefficients. FIG. 14A shows how 90 degree (quarter-wave) lines 941, 942 can be inserted in opposite sides of a divider/combiner in a two-way power amplifier 900 to obtain quadrature operation and reflection coefficient cancelation. The two-way power amplifier 900 of FIG. 14A is similar to that of FIG. 3 in that the splitter 910, constituent amplifiers 901, 902, and combiner 920 are all interconnected in a similar manner. In addition, phase shifters 931, 932 are provided at the input of the constituent amplifiers 901, 902 in a manner similar to that of the phase shifters 731-734 of FIG. 7. In another aspect of the present invention, the input Wilkinson splitter 910 and quarter-wave line 941 could be replaced with a 90 degree hybrid coupler such as a Lange coupler or branch-line coupler to achieve quadrature operation with the output coupler being a Gysel coupler 920 fed in quadrature with 90 degree line 942.

Figure 14B:
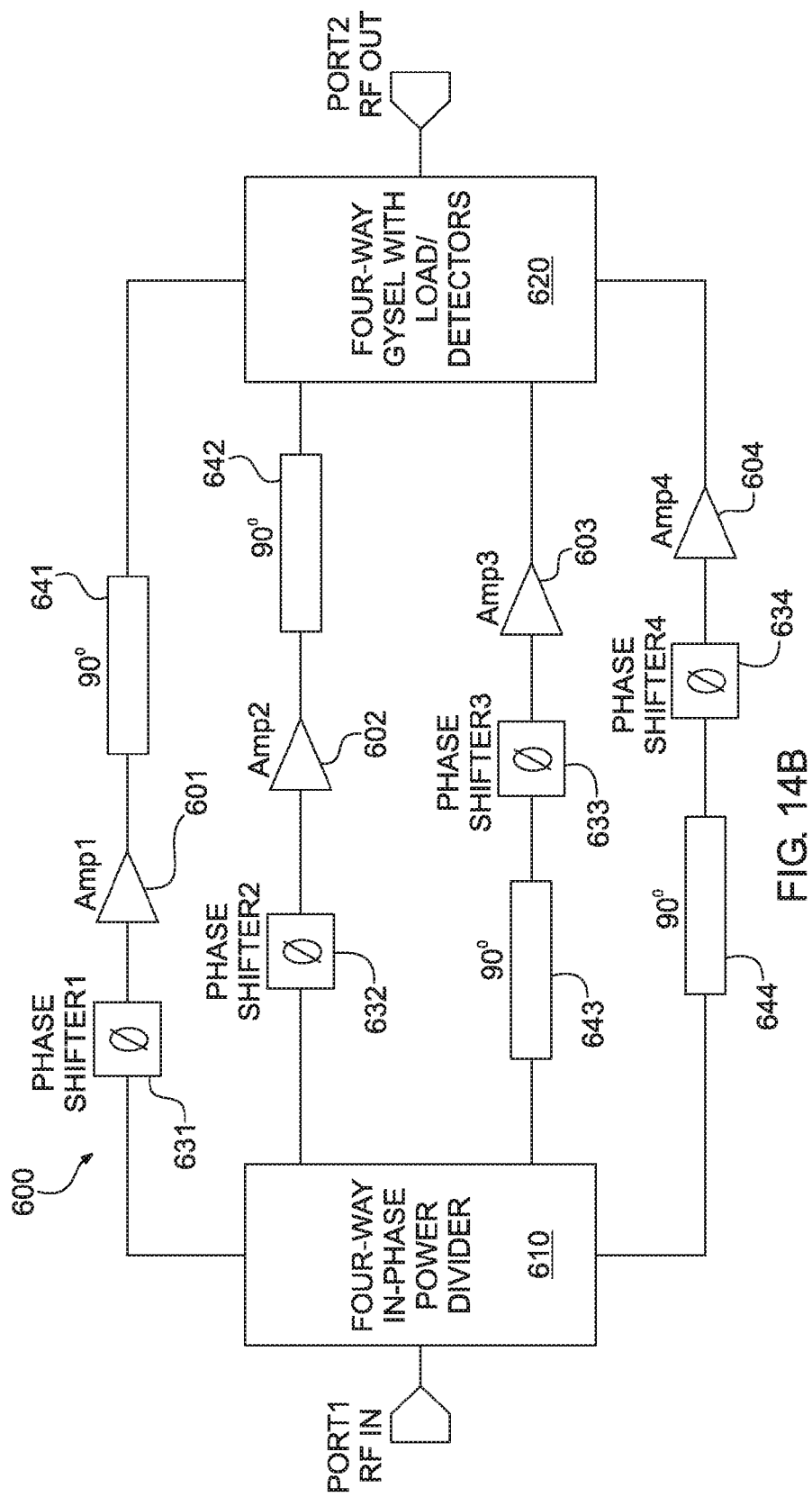
FIG. 14B schematically illustrates quadrature operation of a four-way Gysel combiner in accordance with the present invention.

It is possible to obtain quadrature operation in an N-way Gysel-combined amplifier when N is an even number. This is shown in FIG. 14B, for a four-way circuit. Quarter-wave lines 641 and 642 are placed at the outputs of Amp1 and Amp2 (601 and 602 respectively), and quarter-wave lines 643, 644 are placed at the inputs of Amp3 and Amp4 (603 and 604 respectively). This will also serve to cancel the reflection coefficients at the power amplifier input and output. In addition, phase shifters 631-634 are provided at the input of the constituent amplifiers 601-604, and a splitter 610 and combiner 620 are interconnected in a similar manner to that of FIG. 14A.

Figure 14C:
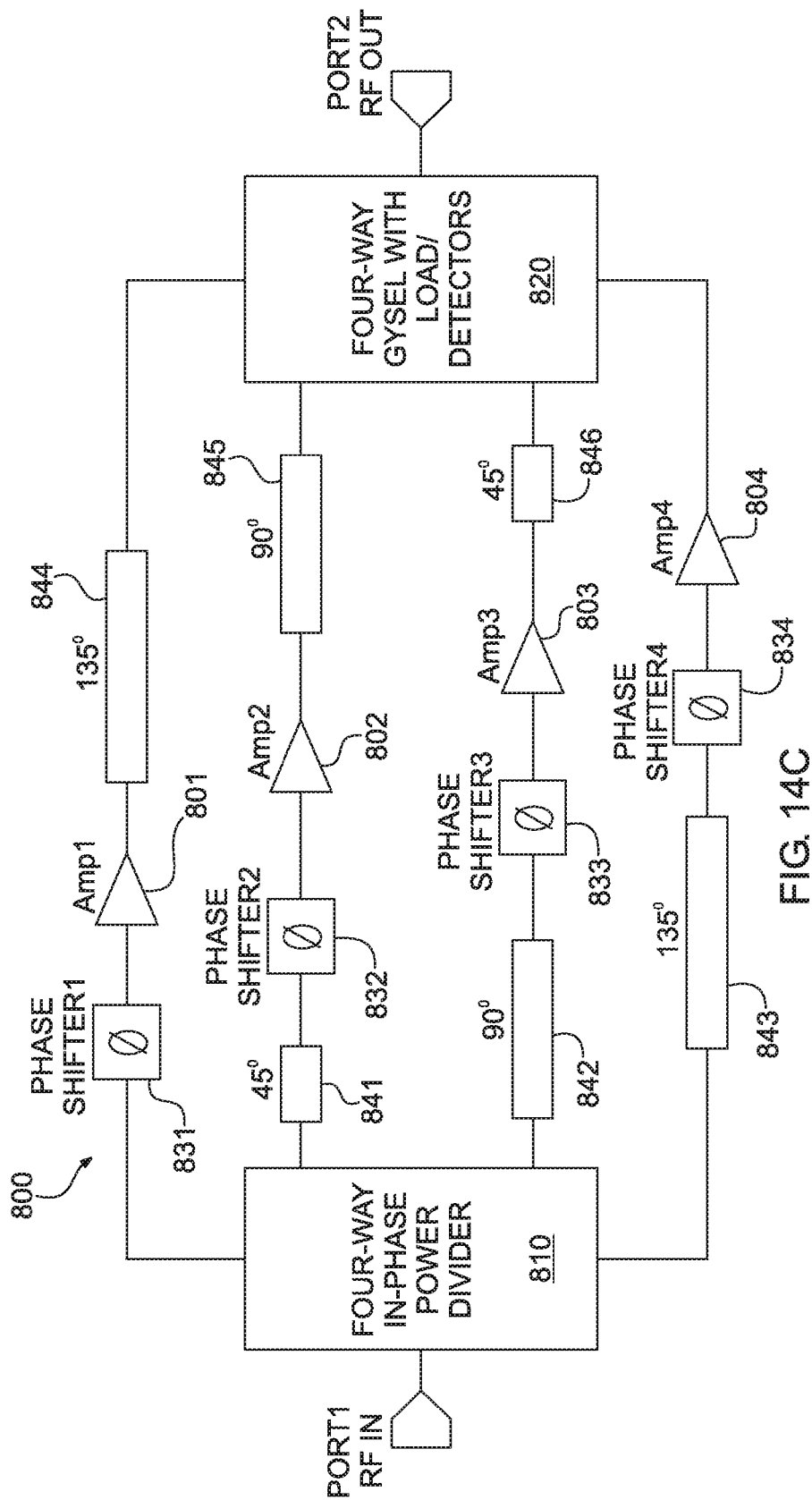
FIG. 14C schematically illustrates poly-phase operation of a four-way Gysel combiner in accordance with the present invention.

Poly-phase reflection-coefficient cancellation is shown in FIG. 14C, for any N-way power amplifier including odd-numbers of amplifiers. Phase shifters 831-834 are provided at the input of constituent amplifiers 801-804, and a splitter 810 and combiner 820 are interconnected in a similar manner to that of FIG. 14A. Here, the input reflection coefficients of the phase shifters 831-834 are staggered in 180/N steps by lines 841, 842, 843, while the output reflection coefficients of the amplifiers are staggered in 180/N steps by lines 844, 845, 846. Thus, for N=4, the three shift values are 45°, 90°, and 135°, or in set theory notation the set of values from which the lines are selected is $$\left\{ x \cdot \frac{180°}{N} \,\middle|\, x \in I, 1 \leq x \leq N-1 \right\}$$

i.e., $$\left\{ \frac{180°}{4}, 2 \cdot \frac{180°}{4}, 3 \cdot \frac{180°}{4} \right\}$$

or {45°, 90°, 135°}. For a given value of N, 2·(N−1) lines may be selected from the set, e.g., for N=4, six lines 841-846, are used, FIG. 14C. Moreover, the lines may be provided such that the sum of any lines provided at the input and output of a given constituent amplifier equals $$3 \cdot \frac{180°}{4},$$

and none of the line segments are repeated on input or output. Thus, lines 844, 843 have a phase of 135°, lines 841, 846 have a phase of 45°, and lines 842, 825 have a phase of 90°, respectively. This has the effect of arranging the reflection coefficients in a circle around Z0 on a Smith chart, where the average of the N reflections becomes zero.

Turning now to FIG. 1A, the concepts illustrated in models of FIGS. 3-12, along with additional features of the present invention, are exemplified in a circuit diagram of the smart power combiner 100. For example, the smart power combiner includes a splitter 110 (such as a Wilkinson divider with isolation resistor 112); phase shifters 131, 132; 90 degree (quarter-wave) lines 141, 142; constituent amplifiers 101, 102; and a combiner 120 (such as a Gysel combiner), all of which may be interconnected in the same manner as the similarly named components illustrated in FIGS. 14A-14C. In addition, the smart power combiner 100 includes further exemplary features of the present invention expanding on those discussed above in connection with FIGS. 3-12.

Intelligent Termination

Figure 1B:
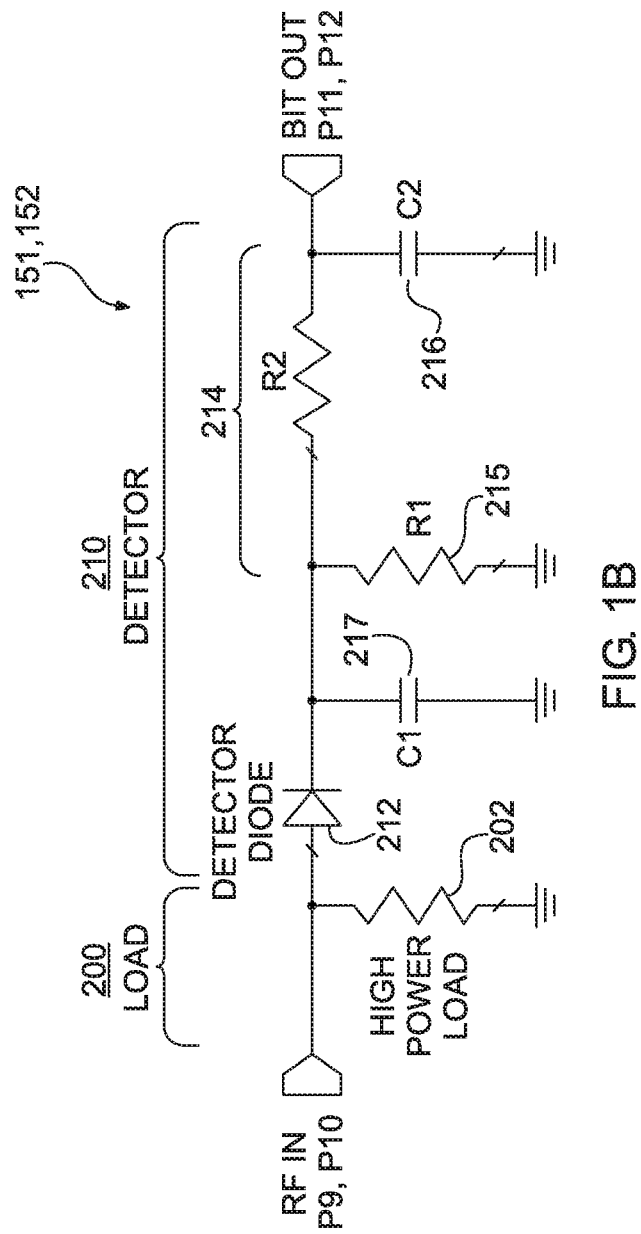
FIG. 1B schematically illustrates a load/detector in accordance with the present invention which is used to monitor wasted power.

For instance, in another of its aspects, the smart power combiner of the present invention may include a new form of termination, a load/detector 151, 152, where a load termination 200 is directly integrated with a Schottky or other semiconductor diode detector 210, FIG. 1B. This load/detector 151, 152, also termed an "intelligent termination" herein, may not require external power for operation (the diode detector may require a voltage bias). Its response does not depend on heating which would create significant time delay compared to a semiconductor detector. Rather, in response to an input RF signal, RF IN, power that is dissipated in a load resistor 202 is sensed by a diode detector 212 and converted to a voltage. The decoupled DC output from the detector indicates how much power is dissipated, following the square-law for example.

Further, an intelligent termination may be provided in the form of an impedance-matched RF termination comprising in the simplest case a load resistor 202 capable of dissipating RF power, an integrated diode detector 212, an RC decoupling network 214 using at least one ground return such as resistor 215 and one or more capacitors 216, 217. The load/detector 151, 152 may provide both an impedance-matched RF input port, RF IN, and a high-impedance DC output port, BIT OUT, that is decoupled from the RF input port, RF IN.

The load/detectors 151, 152 may be used to monitor wasted power at each of the respective constituent amplifiers 101, 102, such as loss due to phase mismatching, when the load/detectors 151, 152 are substituted for the power combiner's commonly-used isolation loads. At the RF input side of the load/detector, a load 200 of sufficient power capacity (application-dependent) is used to dissipate incident RF power. The diode 212 rectifies the RF voltage, and the RC decoupling network 214 of passive components 215-217 provides DC and RF ground for the diode 212 and a direct current output signal which provides built-in-test capabilities (BIT). The BIT signal may be directly correlated to exact power that is dissipated in the load 200 through an equation, curve fit or lookup table. In an N-way amplifier, there will be N BIT signals, one associated with each amplifier. Because the load 200 is integrated to the detector 210, the entire circuit may be optimized for broad-band performance in terms of VSWR at the input ports P9, P10 and other parameters. For example, the design can be optimized for better RF impedance match than if the load and detector were independent designs, i.e., the load resistor 202 could be increased to greater than Z0 to account for loading of the detector 212.

The diode detector 212 may be configured in parallel to the load resistor 202 such that the full RF voltage is available for sensing. The impedance of the diode detector 212 may be much higher than the characteristic impedance of the system, yet the detector's loading effect may be compensated to achieve a broadband impedance match; for example, if the detector presents 500 ohms to the RF signal, the load resistor could be 55 ohms to achieve 50 ohms in parallel to match to 50 ohms system impedance. The majority of the signal's energy may be dissipated in the load resistor 202, as the load resistor 202 is of much closer to system impedance Z0 than the detector 212. In addition, the response of the load/detectors 151, 152 may be fast but not instantaneous, as the detector output voltage is integrated over a series of pulses though the RC decoupling network 214, though it may be orders of magnitude faster than any means employing thermal response.

Viewed in-situ in the smart power amplifier 100, the wasted RF power from the Gysel combiner 120 enters the input ports P9, P10 of the load/detectors 151, 152, respectively, and is largely dissipated in the high power load 200, FIGS. 1A, 1B. Voltage is scavenged by the diode detector circuit 210 and a direct current "built in test" of BIT signal, BIT OUT, is output at ports P11, P12.

The load/detectors 151, 152 may be implemented monolithically on a GaN, GaAs, InP, silicon, or other RF semiconductor processes, or using discrete components. One desirable way to fabricate the load/detectors 151, 152 is to use a GaN-on-silicon carbide process. SiC can provide tremendous heat spreading capabilities (k=400 W-m-K). The Schottky diode 212 may be monolithically integrated with the load 200, along with the RC coupling network 214. Indeed, there is often wasted area at the input side of a power amplifier 101, 102, because the input stage active devices are much smaller than the output stage devices. Thus, the input side can be an ideal location for implementing the load/detectors 151, 152 with no added cost. Special consideration must be paid to electrically isolating the intelligent termination from the amplifier's RF path to prevent feedback which could lead to oscillations. In this respect it may be advantageous to provide the intelligent termination as a discrete component. A reference diode may be fabricated on the intelligent termination to provide a means for compensating for temperature and/or manufacturing tolerances.

Phase Control System

With the inclusion of the load/detectors 151, 152 to monitor any wasted power from each of the respective constituent amplifiers 101, 102, the monitored power may be analyzed to determine the phase correction required to phase-align the constituent amplifiers 101, 102, the utility of which has been demonstrated above in connection with the discussion of FIGS. 3-12. In this regard a control system 150 may be provided to receive the monitored power from the load/detectors 151, 152, to analyze the received powers, and to deliver a corrective signal to the phase shifters 131, 132, FIG. 1A. Thus, the waste power may be monitored continuously at the load/detectors 151, 152, and the control system 150 may adjust phase dynamically and automatically in response to the monitored power. Such dynamic and automatic phase-alignment can prove advantageous, particularly in accounting for variations in system behavior. For instance, optimum phase settings can vary with temperature and input power. In addition, for amplifiers that have different phase slopes, there may be a benefit to setting up different phase settings versus frequency.

Phase control system can be simple or complex depending on application. In one embodiment, phase settings may be singular. In this case, optimum conditions may be determined at the factory, and the phase settings strapped to the correct value, which could be done in hardware or software. This could provide costs savings in manufacturing, as trial and error correction is avoided.

Output Power Monitor Using a Shunt Coupler and Detector

In addition to the above features of the exemplary smart power combiner 100, it is often desirable to have a means to monitor the output power of a power-combined amplifier, which is sometimes called a high-power indicate (HPI) function. A shunt coupler 160 is connected to the output of the power amp 100 in FIG. 1A. The coupled port of the shunt coupler 160 may be fed to a detector 170 to provide an analog direct-current signal that is a direct measure of output power level. Thus, the shunt coupler 160 can provide a very low loss means of coupling off energy to a detector circuit 170, FIGS. 1A, 15A. A high-impedance quarter-wave line is configured in shunt to the output P7, RF OUT, and a third port P8 is tapped off close to the ground connection, FIG. 15A. The coupling value to the third port P8 is a strong function of its impedance; in the exemplary configuration of FIG. 15A, impedance was assumed to be 50 ohms and was positioned to achieve −30 dB coupling at band center (10 GHz). The loss of the through arm (P6 to P7) is less than −0.02 dB over 20% bandwidth in this case. The shunt coupler 160 may provide a number of advantages such as: reducing loss at the output of the power amplifier 100, being compact and easy to fabricate, and not require a fourth-port termination that a coupled-line coupler would require. As the shunt coupler 160 provides a short circuit to direct current, it also serves to provide a measure of electrostatic discharge control to the amplifier's RF output port. In addition, the BIT signal from the detector 170, BITS, can be supplied to the control system 150 and compared to a reference level to generate a two-state high-power indication within the control system 150. The reference level can be temperature compensated to mimic any temperature dependence of the detector 170.

Figure 15B:
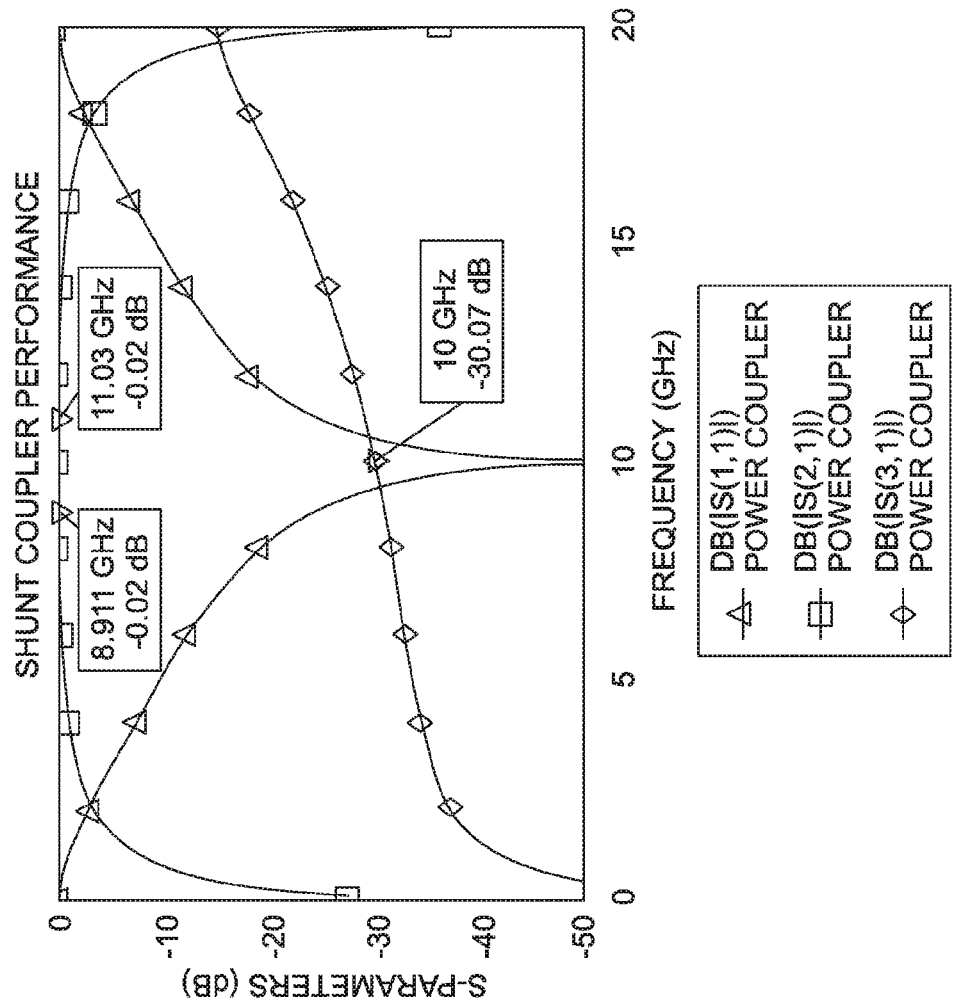
FIG. 15B illustrates insertion loss (S21), impedance match (S11), and coupling coefficient (S31) of the shunt coupler of FIG. 15A under ideal conditions in a fifty ohm system centered at 10 GHz.
Figure 15A:
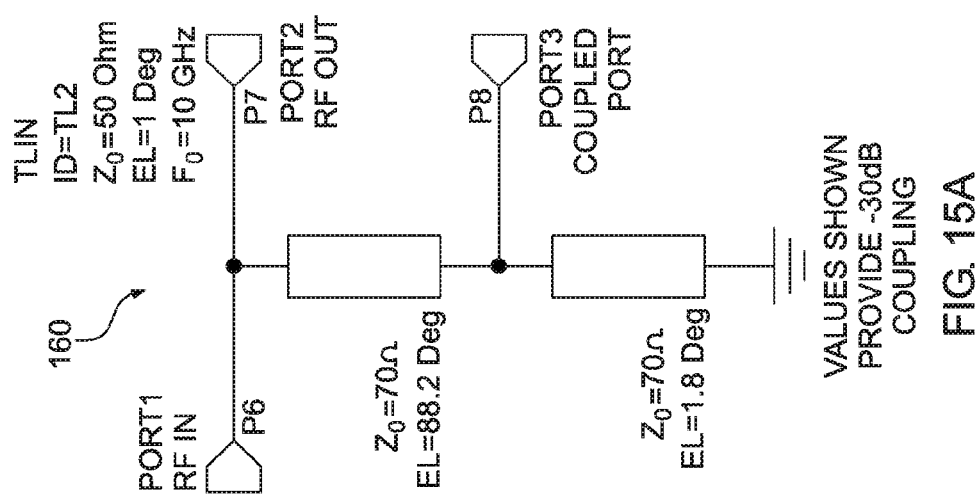
FIG. 15A schematically illustrates a shunt coupler for power detection at the output of a smart power combiner in accordance with the present invention.

The performance of the shunt coupler 160 is illustrated in FIG. 15B, which shows the insertion loss (S21), impedance match (S11), and coupling coefficient (S31) of the shunt coupler 160 under ideal conditions in fifty ohm system centered at 10 GHz for the schematic that is also shown in FIG. 15. The insertion loss in this simulated case is due entirely to mismatch (ignoring attenuation due to skin effect etc.) and is shown to be less than 0.02 dB over more than 20% bandwidth. Impedance match looking into port P6 or port P7 is the same by symmetry and is greater than 20 dB return loss over 20% bandwidth. The coupling coefficient (S31) is 30 dB for the case that is shown, and can be adjusted by moving the tap closer or farther away from the ground connection. The coupling coefficient is not flat with frequency as a coupled-line coupler might be; however, the high-power indicate function is not meant to provide an exact power measurement, merely an indication that high power is present, thus a degree of coupling inaccuracy is acceptable over frequency.

Drain Voltage Sense Monitor

Voltage drop to a power amplifier drain is important in design and operation of a solid-state power amp, and the connection to monitor drain voltage should be as close to the power amplifier as possible. In a further aspect of the present invention, a drain sense 180 may be integrated on-board a MMIC (Monolithic Microwave Integrated Circuit) implementation of the smart power amplifier 100, in a position to monitor the absolute drain voltage of the amplifier 100, FIG. 1A. (Even the voltage drop of the drain supply bond wires is thus monitored.) A separate bond-pad may be provided to route the drain sense back for built-in-test. As there is no current associated with a sense wire 181, it does not need to be a high-conductance connection on or off the chip (as opposed to the drain supply connection, which requires high conductance). The drain sense 180 may be a highly resistive connection in order to block RF energy from escaping the amplifier 100, and may be connected to a transistor using a high-value resistor, e.g., 10 kΩ. The drain sense 180 may be configured without any increase in amplifier die area, since the drain sense 180 can be very small and fit in an unused area. If the drain sense 180 is not required, it need not be connected. In the event where a monolithic amplifier must be used that does not provide a built-in voltage sense, the voltage sense feature can be provided externally with a suitable high-value resistor coupled to the drain supply as close to the amplifier as possible.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A power-combined amplifier, comprising:
   first and second constituent amplifiers each having a respective power output;
   a power combiner electrically connected to the power outputs of the first and second constituent amplifiers, the power combiner having an output configured to deliver the combined power outputs of the constituent amplifiers and having a respective isolated termination for each of the first and second constituent amplifiers; and
   at least one detector operably connected to the isolated terminations of the first and second constituent amplifiers and configured to measure a load excitation at each of the isolated terminations.

2. The power-combined amplifier according to claim 1, comprising a controller operably connected to the at least one detector to receive the measured load excitations of the first and second constituent amplifiers, the controller configured to analyze the measured load excitations and determine a phase mismatch between the first and second constituent amplifiers.

3. The power-combined amplifier according to claim 2, wherein the first constituent amplifier comprises an amplifier input and the power-combined amplifier comprises a phase shifter in electrical communication with the amplifier input, and wherein the phase shifter is operably connected to the controller and the controller is configured to communicate a signal to the phase shifter to correct the phase mismatch between the first and second constituent amplifiers.

4. The power-combined amplifier according to claim 2, wherein the controller is configured to determine a magnitude and sign of the phase mismatch between the first and second constituent amplifiers.

5. The power-combined amplifier according to claim 2, wherein the controller is configured to determine the frequency of a load excitation null at the respective power output of each of the first and second constituent amplifiers and is configured to determine the phase difference between the first and second constituent amplifiers from the respective determined frequencies of the load excitation nulls of the first and second constituent amplifiers.

6. The power-combined amplifier according to claim 2, wherein the controller is configured to determine the phase mismatch between the first and second constituent amplifiers according to the formula $\Delta\phi = -0.9\,\Delta F$, where $\Delta\phi$ is the transmission phase difference between the first and second constituent amplifiers measured in degrees and $\Delta F$ is the frequency difference in nulls of the measured load excitations measured as a percentage of bandwidth.

7. The power-combined amplifier according to claim 1, wherein the at least one detector comprises a first detector operably connected to the isolated termination of the first constituent amplifier and a second detector operably connected to the isolated termination of the second constituent amplifier.

8. The power-combined amplifier according to claim 1, wherein the first constituent amplifier and the at least one detector are disposed on a MMIC.

9. The power-combined amplifier according to claim 1, wherein the power combiner comprises a Gysel power combiner.

10. The power-combined amplifier according to claim 1, wherein the first constituent amplifier comprises an amplifier input and the power-combined amplifier comprises a phase shifter in electrical communication with the amplifier input.

11. The power-combined amplifier according to claim 1, comprising a shunt coupler in electrical communication with the power combiner output, the shunt coupler having a high-impedance quarter-wave line configured to shunt the power output to ground and having a port tapped-off proximate to the ground.

12. The power-combined amplifier according to claim 11, comprising a shunt detector in electrical communication with the port and configured to detect the power at the power output of the power combiner.

13. The power-combined amplifier according to claim 1, wherein the at least one detector comprises an impedance-matched RF termination including a load resistor capable of dissipating RF power.

14. The power-combined amplifier according to claim 13, wherein the at least one detector comprises a Schottky diode.

15. The power-combined amplifier according to claim 13, wherein the at least one detector comprises an impedance-matched RF input port and a high-impedance DC output port that is decoupled from the RF input port.

16. A power-combined amplifier, comprising:
N constituent amplifiers each having a respective power input and power output, where N is three or more;
a power combiner electrically connected to the power outputs of the N constituent amplifiers, the power combiner having an output configured to deliver the combined power outputs of the constituent amplifiers;
a plurality of reflection-phase correction lines, each of the lines electrically connected to the power input or power output of a respective constituent amplifier, the reflection-phase correction lines are selected from the set of values of $$\left\{ x \cdot \frac{180°}{N} \,\middle|\, x \in I, 1 \le x \le N-1 \right\}.$$

17. The power-combined amplifier according to claim 16, wherein a selected first of the plurality of reflection-phase correction lines is electrically connected to the input of a selected constituent amplifier, a selected second of the plurality of reflection-phase correction lines is electrically connected to the output of the selected constituent amplifier, and wherein the sum of the values of the selected first and second lines is $$(N-1) \cdot \frac{180°}{N}.$$

18. The power-combined amplifier according to claim 16, wherein the plurality of reflection-phase correction lines comprises 2N−2 lines selected from the set of values.

19. A power-combined amplifier, comprising:
N constituent amplifiers each having a respective power input and power output, where N is an even number greater than two, the N constituent amplifiers comprising first and second groups of N/2 amplifiers;
a power splitter having a power input and N power outputs, each splitter output electrically connected to the power input of a respective constituent amplifier;
a power combiner electrically connected to the power outputs of the N constituent amplifiers, the power combiner having an output configured to deliver the combined power outputs of the constituent amplifiers; and
N 90° reflection-phase correction lines, half of which are disposed in electrical communication with the power input of a respective constituent amplifier of the first group and half of which are disposed in electrical communication with the power output of a respective constituent amplifier of the second group.

20. A method for combining power outputs of constituent amplifiers with phase matching, comprising:
combining the power outputs of first and second constituent amplifiers;
determining the frequency of a load excitation null at the respective power output of each of the first and second constituent amplifiers;
determining the phase difference between the first and second constituent amplifiers from the respective determined frequencies of the load excitation nulls of the first and second constituent amplifiers; and
applying a phase correction related to the determined phase difference to at least one of the first and second constituent amplifiers to decrease phase mismatch between the first and second constituent amplifiers.

21. The method according to claim 20, wherein $\Delta\phi = -0.9 \Delta F$, where $\Delta\phi$ is the phase difference between the amplifiers measured in degrees and $\Delta F$ is the frequency difference in load excitation nulls measured as a percentage bandwidth.

22. The method according to claim 20, wherein the step of determining the phase difference comprises determining a magnitude and sign of the phase mismatch between the first and second constituent amplifiers.

23. The method according to claim 20, wherein the step of applying a phase correction comprises providing a controller operably connected to at least one of the first and second constituent amplifiers, and wherein the controller provides the phase correction to at least one of the first and second constituent amplifiers to decrease phase mismatch between the first and second constituent amplifiers.

24. The method according to claim 20, wherein the step of determining the frequency of a load excitation null comprises providing at least one detector operably connected to a respective isolated termination of each of the first and second constituent amplifiers and comprises measuring the load excitation nulls at each of the isolated terminations.

25. The method according to claim 24, comprising providing a controller operably connected to the at least one detector to receive the measured load excitations of the first and second constituent amplifiers and analyzing, with the controller, the measured load excitations and determining a phase mismatch between the first and second constituent amplifiers.

26. A power amplification device having monitored power output, comprising:
a power amplifier having a power output;
a shunt coupler in electrical communication with the power output, the shunt coupler comprising a high-impedance quarter-wave line configured to shunt the power output to ground and having a port tapped-off proximate to the ground; and
a detector in electrical communication with the port and configured to detect the power at the power output of the power amplifier.

* * * * *